(12) United States Patent
Matsumoto et al.

(10) Patent No.: US 12,120,837 B2
(45) Date of Patent: Oct. 15, 2024

(54) HOLDING DEVICE

(71) Applicant: HONDA MOTOR CO., LTD., Tokyo (JP)

(72) Inventors: Takashi Matsumoto, Wako (JP); Tsutomu Takahashi, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 378 days.

(21) Appl. No.: 17/620,760

(22) PCT Filed: Jun. 26, 2020

(86) PCT No.: PCT/JP2020/025287
§ 371 (c)(1),
(2) Date: Dec. 20, 2021

(87) PCT Pub. No.: WO2020/262630
PCT Pub. Date: Dec. 30, 2020

(65) Prior Publication Data
US 2022/0418137 A1    Dec. 29, 2022

(30) Foreign Application Priority Data

Jun. 27, 2019 (JP) ................................ 2019-120557
Jun. 27, 2019 (JP) ................................ 2019-120560
(Continued)

(51) Int. Cl.
*H05K 7/02* (2006.01)
*H01M 10/44* (2006.01)
*H02J 7/00* (2006.01)

(52) U.S. Cl.
CPC ............ *H05K 7/02* (2013.01); *H01M 10/441* (2013.01); *H02J 7/0042* (2013.01)

(58) Field of Classification Search
CPC ....... H05K 7/02; H01M 10/441; H02J 7/0042
(Continued)

(56) References Cited

U.S. PATENT DOCUMENTS

2017/0117729 A1*  4/2017  Hirose .................. G06F 1/1632
2019/0393627 A1   12/2019  Etsunagi et al.
2020/0266641 A1*   8/2020  Shikanai .................. H02J 7/00

FOREIGN PATENT DOCUMENTS

JP    3904740    4/2007
JP    6286084    2/2018
(Continued)

OTHER PUBLICATIONS

International Search Report and Written Opinion for International Application No. PCT/JP2020/025287 mailed on Sep. 8, 2020, 9 pages.

*Primary Examiner* — Binh B Tran
(74) *Attorney, Agent, or Firm* — Amin, Turocy & Watson, LLP

(57) ABSTRACT

A battery exchanger in which a mobile battery that has a connector is held by being accommodated or placed therein, wherein the battery exchanger has: a slot for holding the mobile battery; a connector provided to the slot in a manner allowing relative movement, the connector being connected to the connector; a through-hole provided to the slot, the connector being passed through the through-hole; and a shutter provided to the slot in a manner allowing relative movement, the shutter closing off at least a part of the through-hole.

22 Claims, 46 Drawing Sheets

(30) Foreign Application Priority Data

Jun. 27, 2019 (JP) .................................. 2019-120564
Nov. 20, 2019 (JP) .................................. 2019-209388

(58) Field of Classification Search
USPC ........................................................ 361/807
See application file for complete search history.

(56) References Cited

FOREIGN PATENT DOCUMENTS

| WO | 2019/065327 | 4/2019 |
|---|---|---|
| WO | 2019/093082 | 5/2019 |

* cited by examiner

FIG. 7
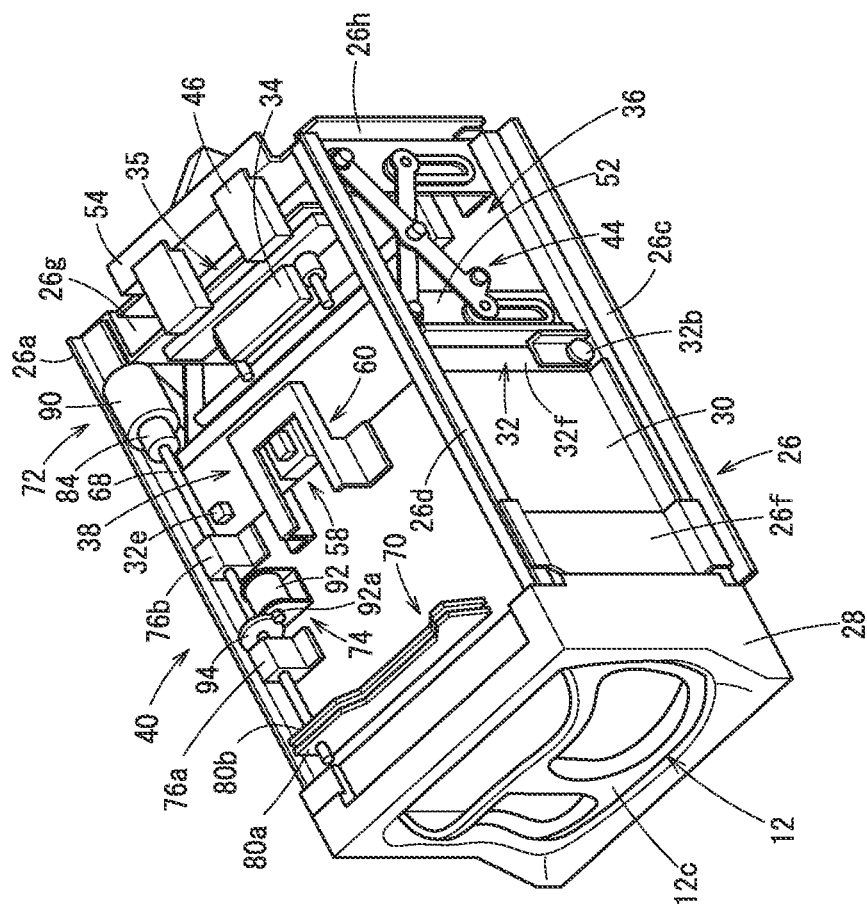
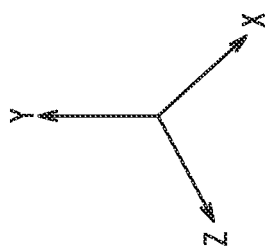

FIG. 11
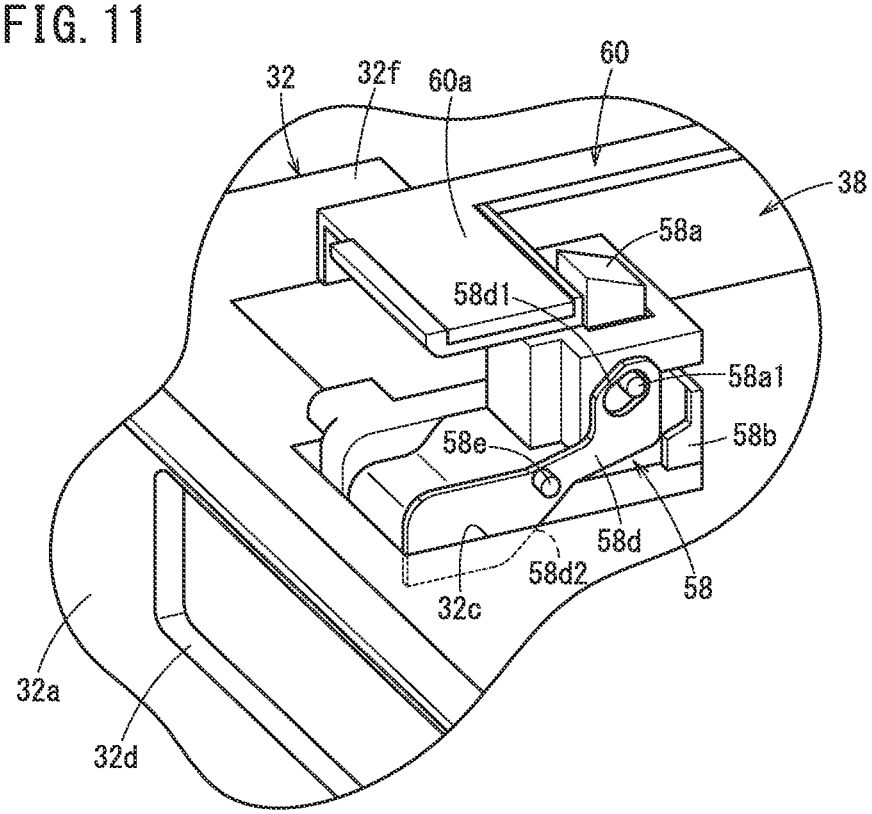
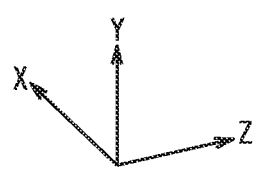

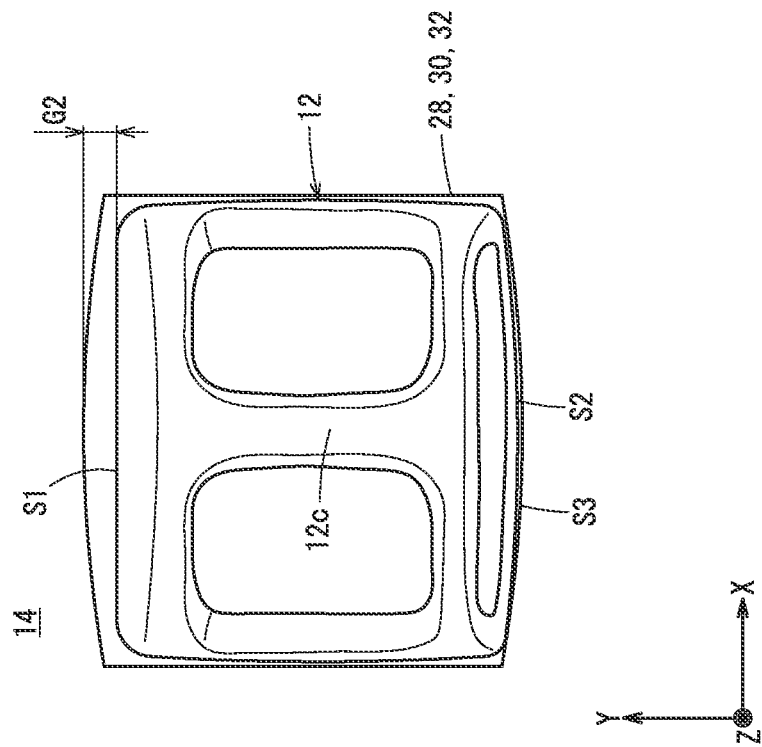
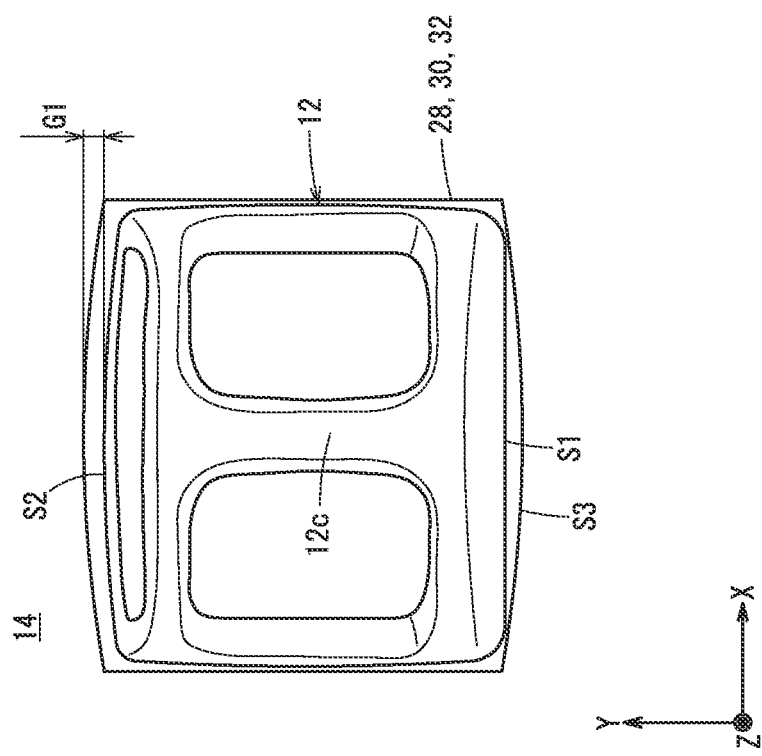

FIG. 19
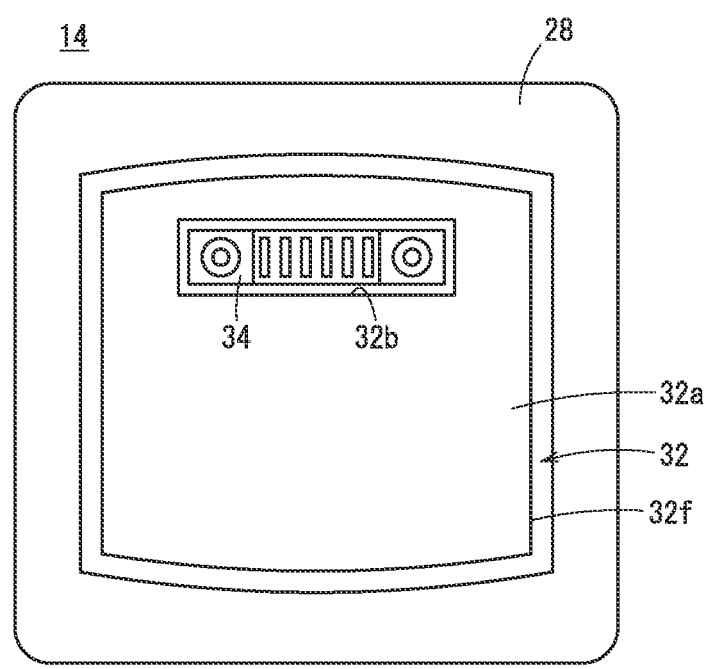
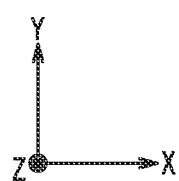

FIG. 31

| STATE | MOVEMENT OF CAM AND LATCH IN ROTATION DIRECTION | MOVEMENT OF CAM AND LATCH IN AXIAL DIRECTION | BATTERY LOCK MECHANISM MOVEMENT |
|---|---|---|---|
| LOCK-RELEASED | | | |
| PRE-LOCKING | | | |

| STATE | MOVEMENT OF CAM AND LATCH IN ROTATION DIRECTION | MOVEMENT OF CAM AND LATCH IN AXIAL DIRECTION |
|---|---|---|
| LOCKED | | |
| MID-LOCK-RELEASE | | |
| LOCK-RELEASED | | |

HOLDING DEVICE

TECHNICAL FIELD

The present invention relates to a holding device in which an electric device having a first terminal is housed or placed, and is held therein.

BACKGROUND ART

JP 3904740 B2 discloses a battery charging device that is capable of charging and discharging a battery in contact with a connector, by inserting the battery into a battery box having the connector provided in a bottom portion thereof.

Furthermore, JP 6286084 B1 discloses a structure in which a connector of a mobile battery is connected to a connector of a connector holder in a housing.

SUMMARY OF THE INVENTION

In the technology disclosed in JP 3904740 B2 and JP 6286084 B1 described above, there is room for improvement with regards to protecting the connector (terminal).

The present invention has been devised in order to solve this type of problem, and has the object of providing a holding device that can improve the protection of the terminal.

An aspect of the present invention is a holding device that holds an electrical device housed or placed therein, the electrical device including a first terminal, the holding device comprising a holding portion configured to hold the electrical device; a second terminal that is provided to be movable relative to the holding portion and connected to the first terminal; an insertion portion that is provided in the holding portion, the second terminal being inserted into the insertion portion; and a cover portion that is provided to be movable relative to the holding portion and configured to cover at least part of the insertion portion.

According to the present invention, it is possible to improve the protection of the terminal.

BRIEF DESCRIPTION OF DRAWINGS

FIG. 7 is a diagram showing a state in which the mobile battery is stored in the slot;
FIG. 11 is a perspective cross-sectional view of the tray lock mechanism in the locked state;
FIGS. 14A and 14B are schematic views of the shapes of an insertion port, a battery holder, a battery tray, and the mobile battery seen from the positive Z-axis direction side;
FIG. 19 is a front view of the slot;
FIG. 31 is a chart showing movement of the cam and latch in the rotation direction, movement of the cam and latch in the axial direction, and movement of the battery lock mechanism;
FIG. 32 is a chart showing movement of the cam and latch in the rotation direction, movement of the cam and latch in the axial direction, and movement of the battery lock mechanism;
FIG. 33 is a chart showing movement of the cam and latch in the rotation direction and movement of the cam and latch in the axial direction.

DESCRIPTION OF THE INVENTION

First Embodiment

Figure 1:
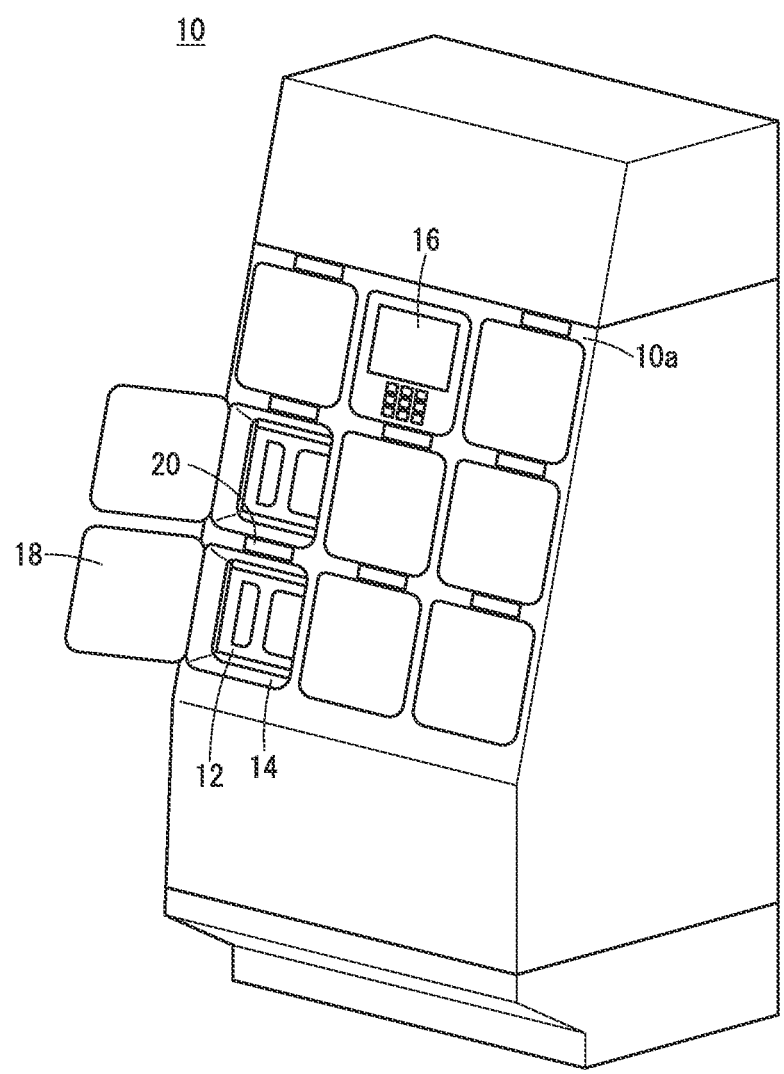
FIG. 1 is a schematic exterior view of a battery exchanger.

FIG. 1 is a schematic exterior view of a battery exchanger 10. The battery exchanger 10 is a device that houses mobile batteries 12 therein and charges the mobile batteries 12. A user deposits the mobile battery 12 that has a low state of charge (SOC) in the battery exchanger 10, and takes out another mobile battery 12 that has been charged from the battery exchanger 10.

The battery exchanger 10 includes eight slots 14 and one operation panel 16. The mobile batteries 12 are housed in the slots 14. When the user houses the mobile battery 12 in the slot 14 and closes a door 18, the battery exchanger 10 starts charging the mobile battery 12. An indicator 20 is provided above the slot 14. The indicator 20 displays the charging state of the mobile battery 12 housed in the slot 14 by lighting up with a certain color, blinking, or the like. The operation panel 16 is a device that is operated by the user. The user pays the fee, for example, by operating the operation panel 16.

Each slot 14 opens on a front surface 10a of the battery exchanger 10. The front surface 10a of the battery exchanger 10 is inclined relative to a vertical direction (direction of gravity), and in a state where the user is standing and facing the front surface 10a, the upper portion of the front surface 10a is positioned farther from the user than the lower portion thereof. Due to this, when the user inserts the mobile battery 12 into the slot 14, the user can assume a posture of leaning forward and easily insert the mobile battery 12 into the slot 14.

Figure 2:
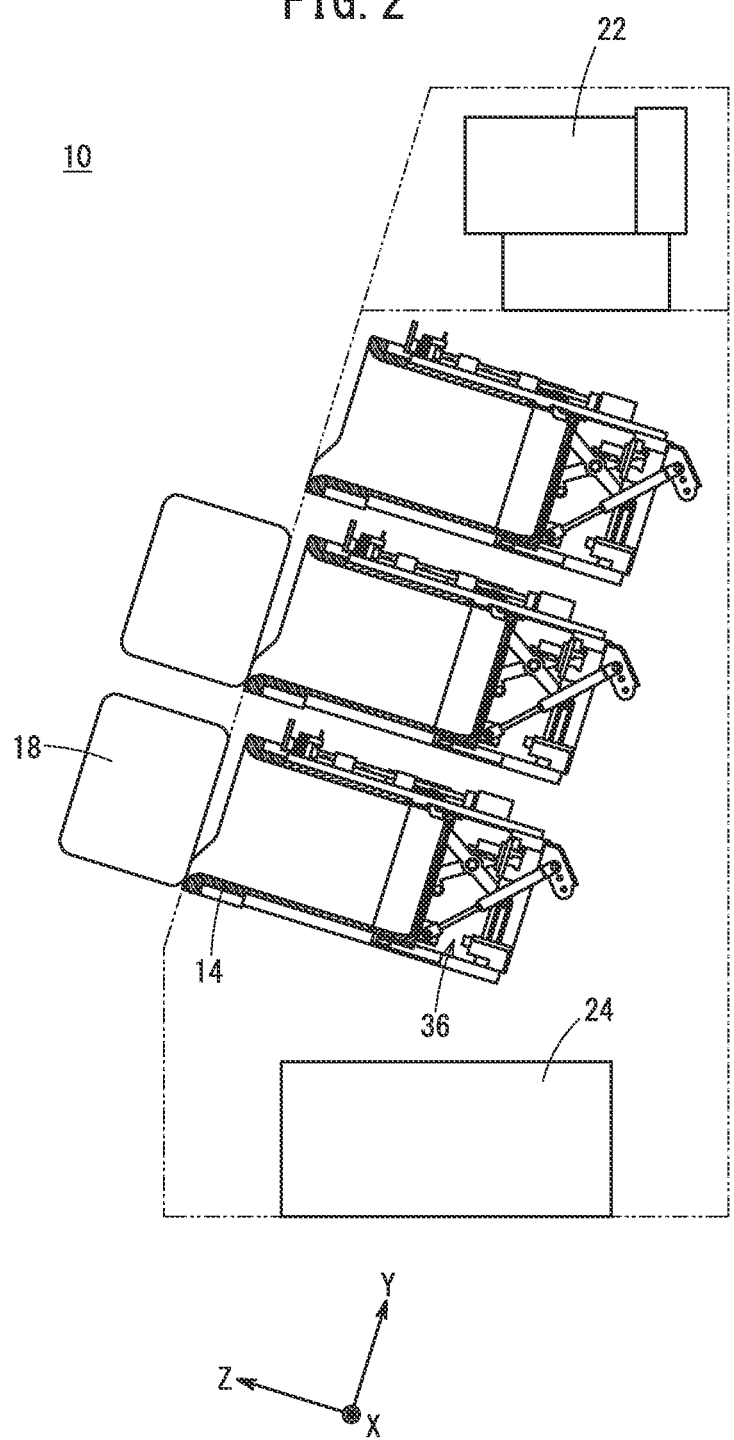
FIG. 2 is a cross-sectional view of the battery exchanger.

FIG. 2 is a cross-sectional view of the battery exchanger 10. The battery exchanger 10 includes a control apparatus 22 above the slots 14. The control apparatus 22 performs charging control and the like of the mobile batteries 12. The battery exchanger 10 includes a utility space 24 below the slots 14. A cooling apparatus for cooling the inside of the battery exchanger 10, for example, is installed in the utility space 24 as optional equipment.

Figure 3:
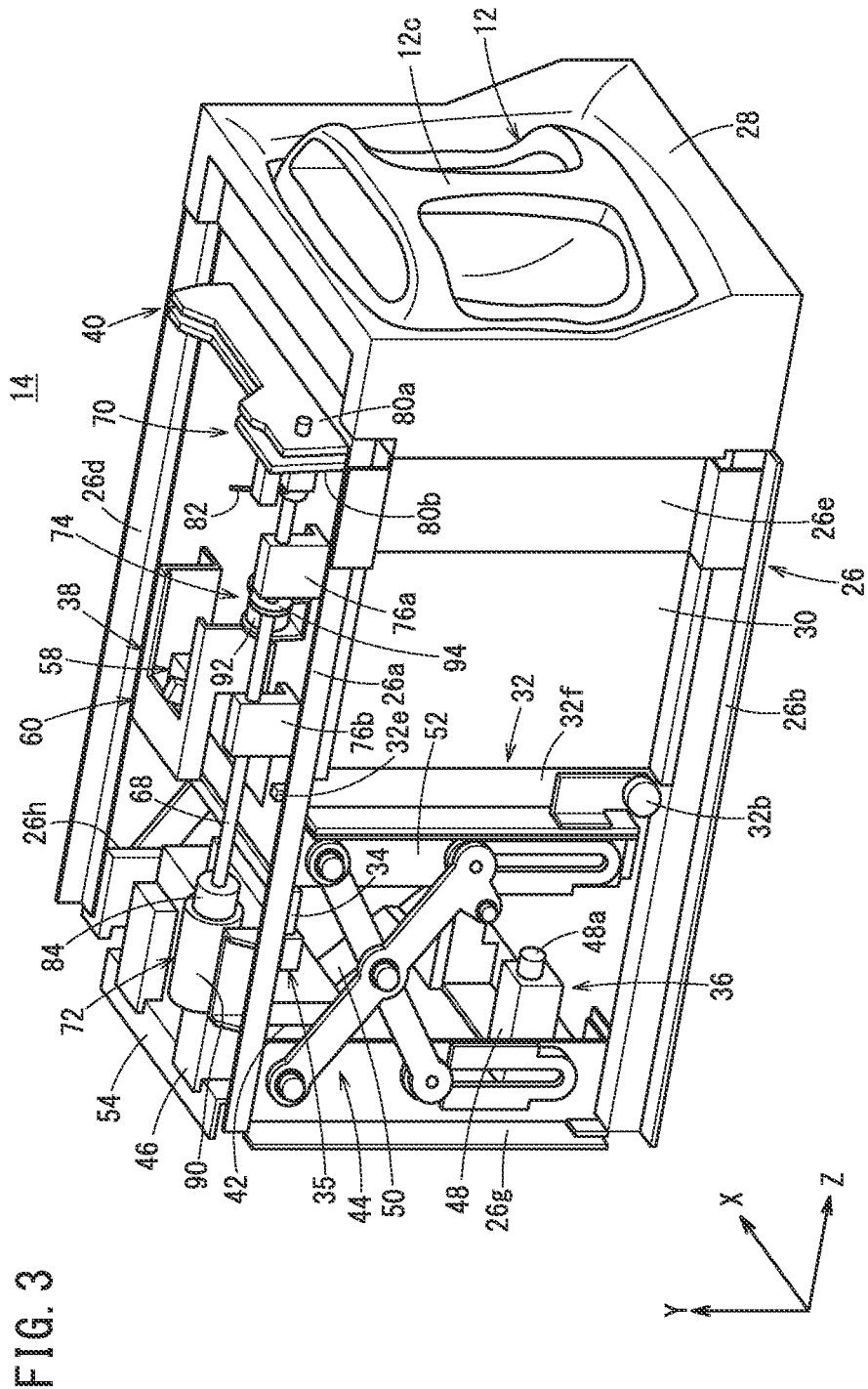
FIG. 3 is a perspective view of a slot.
Figure 4:
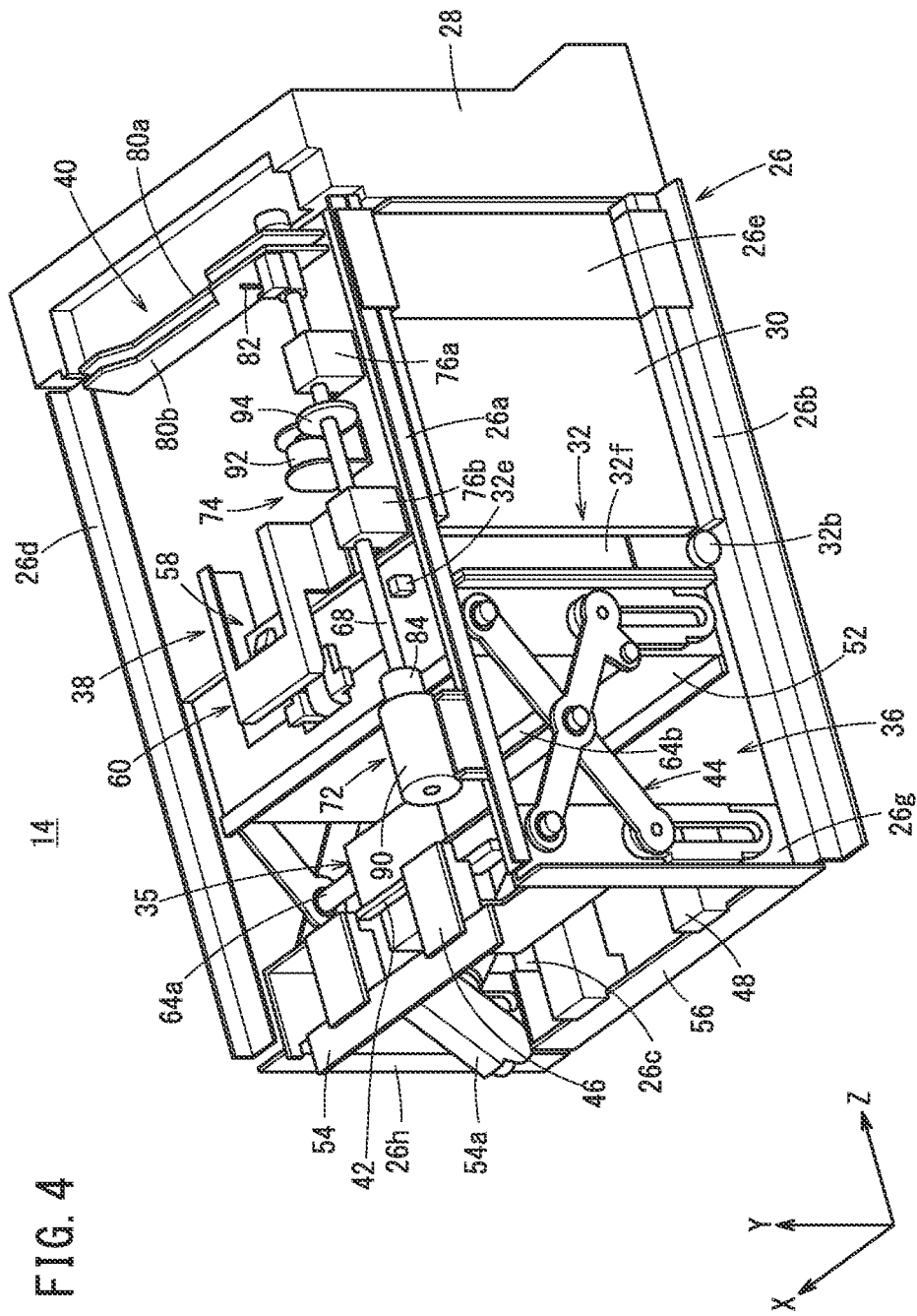
FIG. 4 is a perspective view of the slot.
Figure 5:
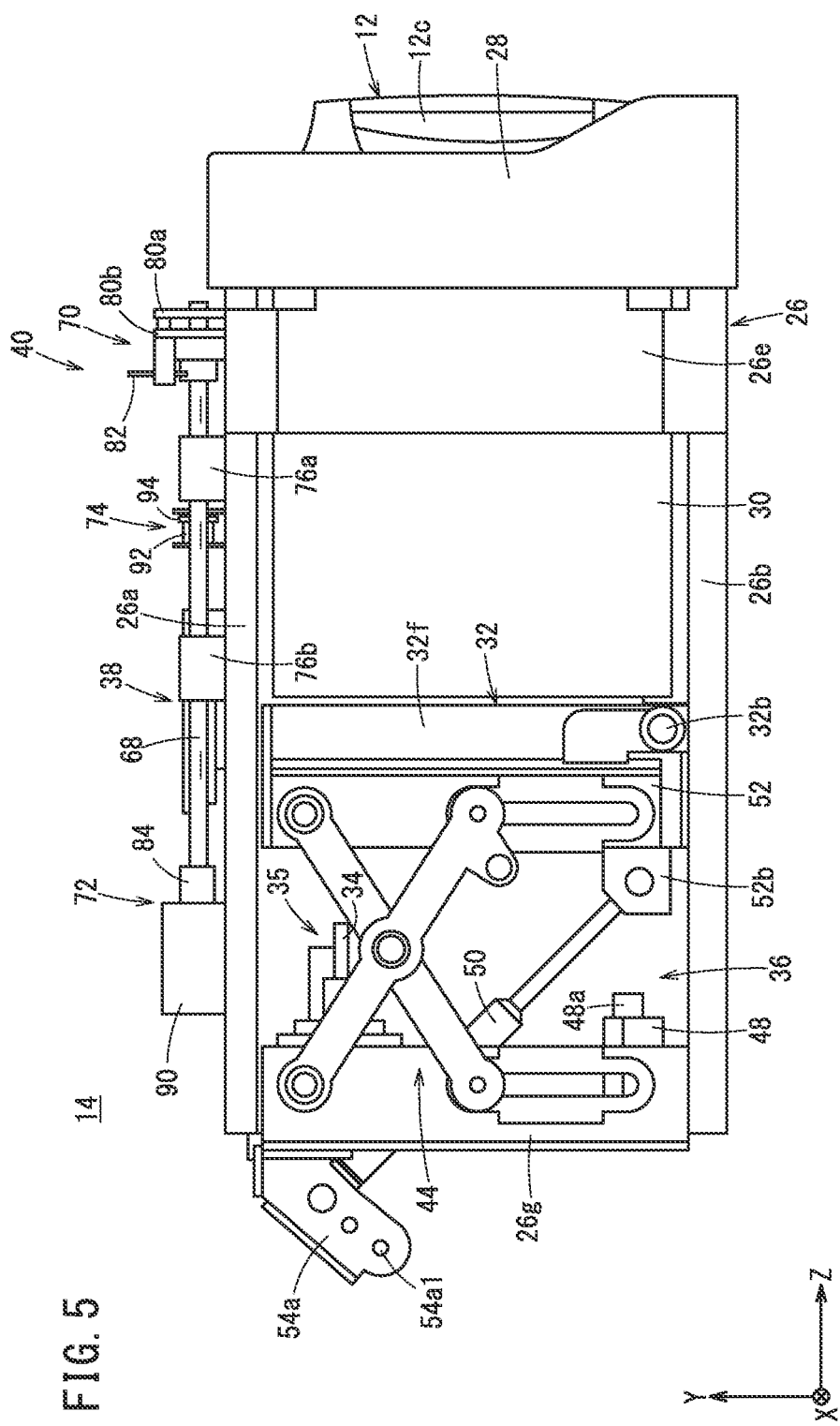
FIG. 5 is a side view of the slot.

FIGS. 3 and 4 are perspective views of the slot 14. FIG. 5 is a side view of the slot 14. In the present embodiment, the description is provided with the X-axis, the Y-axis, and the Z-axis being defined as follows. The direction in which the mobile battery 12 is inserted into the slot 14 is the Z-axis direction, and the side on which the slot 14 opens on the front surface 10a of the battery exchanger 10 is the positive side. The direction parallel to the width direction of the battery exchanger 10 is the X-axis direction, and the right side, when viewed from the side on which the slot 14 opens on the front surface 10a of the battery exchanger 10, is the positive side. The direction orthogonal to the Z-axis and the X-axis is the Y-axis direction, with the upper side being the positive side.

The slot 14 includes a frame 26, an insertion port 28, a battery holder 30, a battery tray 32, a connector unit 35, a tray holding mechanism 36, a tray lock mechanism 38, and a battery lock mechanism 40.

Figure 6:
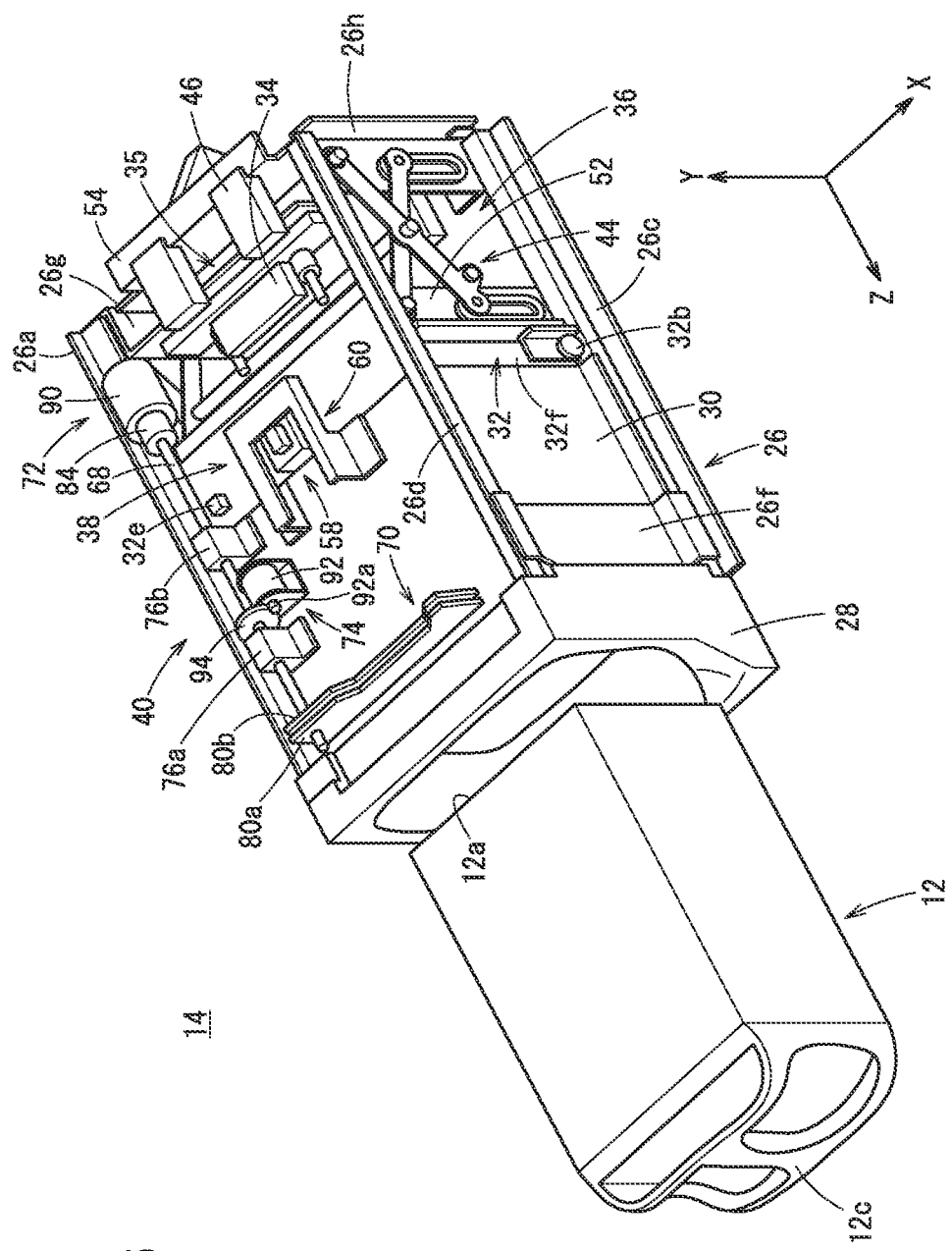
FIG. 6 is a diagram showing a state in which a mobile battery is stored in the slot.

The frame 26 includes main frames 26a to 26d and side frames 26e to 26h (for the side frame 26f, see FIG. 6). The main frames 26a to 26d are pillar-shaped members that extend in the Z-axis direction. The exterior appearance of the slot 14 is a substantially rectangular parallelepiped with the Z-axis direction as the longitudinal direction, and the main frames 26a to 26d are provided at locations correspondingly respectively to the four edges of the rectangular parallelepiped that extend in the longitudinal direction. Among the side frames 26e to 26h, two (side frames 26e and 26f) are provided on the positive Z-axis direction side of the slot 14 and two (side frames 26g and 26h) are provided on the negative Z-axis direction side of the slot 14. The side frame 26e and the side frame 26g are fixed to the main frame 26a and the main frame 26b, which are adjacent thereto in the Y-axis direction.

The side frame 26f and the side frame 26h are fixed to the main frame 26c and the main frame 26d, which are adjacent thereto in the Y-axis direction.

The insertion port 28 is provided at the end portions of the main frames 26a to 26d on the positive Z-axis direction side. The insertion port 28 is formed of resin, and has a through-hole penetrating therethrough in the Z-axis direction. The portion of the insertion port 28 that is close to the negative Y-direction side is formed protruding in the Z-axis direction, compared to the portion thereof that is close to the positive Y-axis direction side. Due to this, when the user inserts the mobile battery 12 into the slot 14, the user can lift the mobile battery 12, place a bottom surface 12a (see FIG. 6) of the mobile battery 12 on the negative Y-axis direction side portion of the insertion port 28, and then insert the mobile battery 12 into the slot 14.

The battery holder 30 is provided adjacent to the insertion port 28 on the negative Z-axis direction side. The battery holder 30 is fixed to the main frames 26a to 26d. Both sides of the battery holder 30 in the Z-axis direction are open, and the space inside the battery holder 30 is in communication with the space inside the insertion port 28. The shape of the inner circumferential surface of the battery holder 30 is formed to be substantially the same as the shape of the inner circumferential surface of the insertion port 28.

The battery tray 32 is provided on the negative Z-axis direction side of the battery holder 30. The battery tray 32 can move in the Z-axis direction along the main frames 26a to 26d, and the movement thereof toward the positive Z-axis direction side can be restricted due to the battery tray 32 contacting the side surface of the battery holder 30 on the negative Z-axis direction side. The battery tray 32 is open on the battery holder 30 side, and has a bottom portion 32a (see FIG. 9 described further below) on the opposite side. In a state where the battery tray 32 is in contact with the side surface of the battery holder 30 on the negative Z-axis direction side, the space inside the battery tray 32 is in communication with the space inside the battery holder 30. The shape of the inner circumferential surface of the battery tray 32 is formed to be substantially the same as the shape of the inner circumferential surface of the battery holder 30. A roller 32b is attached to each side surface of the battery tray 32, on the positive X-axis direction side and the negative X-axis direction side. The rollers 32b are provided on the negative Y-axis direction side of the battery tray 32, and move along the main frame 26b and the main frame 26c to guide the battery tray 32 in the Z-axis direction along the main frame 26b and the main frame 26c.

The connector unit 35 includes a connector 34. The connector 34 is connected to a connector 12b (see FIG. 9 described further below) on the bottom surface 12a of the mobile battery 12, and supplies power to the mobile battery 12. The connector unit 35 is installed in a connector bracket 42 that is fixed to the side frame 26g and the side frame 26h, at the negative Z-axis direction side end portion of the slot 14. The connector unit 35 is arranged near the center of the slot 14 in the X-axis direction, and on the positive side of the center of the slot 14 in the Y-axis direction.

The tray holding mechanism 36 is arranged on the negative Z-axis direction side of the battery tray 32. The tray holding mechanism 36 includes X-links 44, stoppers 46, air dampers 48, and a gas spring 50.

The battery tray 32 includes a tray body 32f and a tray bracket 52, which is arranged to support the negative Z-axis direction side of the tray body 32f. The X-links 44 are provided between the tray bracket 52, and the side frames 26g and 26h. One X-link 44 is provided at each of the positive and negative X-axis direction sides of the battery tray 32.

The stoppers 46 are installed on a stopper bracket 54 that is fixed to the side frame 26g and the side frame 26h, at the negative Z-axis direction side end portion of the slot 14. Two stoppers 46 are arranged, separated from each other in the X-axis direction, at the back surface (positive Y-axis direction side) of the connector unit 35.

The air dampers 48 are installed on an air damper bracket 56 that is fixed to the side frame 26g and the side frame 26h, at the negative Z-axis direction side end portion of the slot 14. Two air dampers 48 are arranged, separated from each other in the X-axis direction, at the negative Y-axis direction side of the slot 14.

The negative Z-axis direction side end portion of the gas spring 50 is attached to a spring bracket 54a that is fixed to the stopper bracket 54, and the positive Z-axis direction side end portion of the gas spring 50 is attached to a spring bracket 52b that is fixed to the tray bracket 52 of the battery tray 32. The gas spring 50 is installed near the center of the slot 14 in the X-axis direction.

The tray lock mechanism 38 restricts the movement of the battery tray 32 toward the negative Z-axis direction side. The tray lock mechanism 38 is described in detail further below.

The battery lock mechanism 40 restricts movement of the mobile battery 12 toward the positive Z-axis direction side, in a state where the mobile battery 12 is housed in the slot 14. The battery lock mechanism 40 is described in detail further below.

Figure 8:
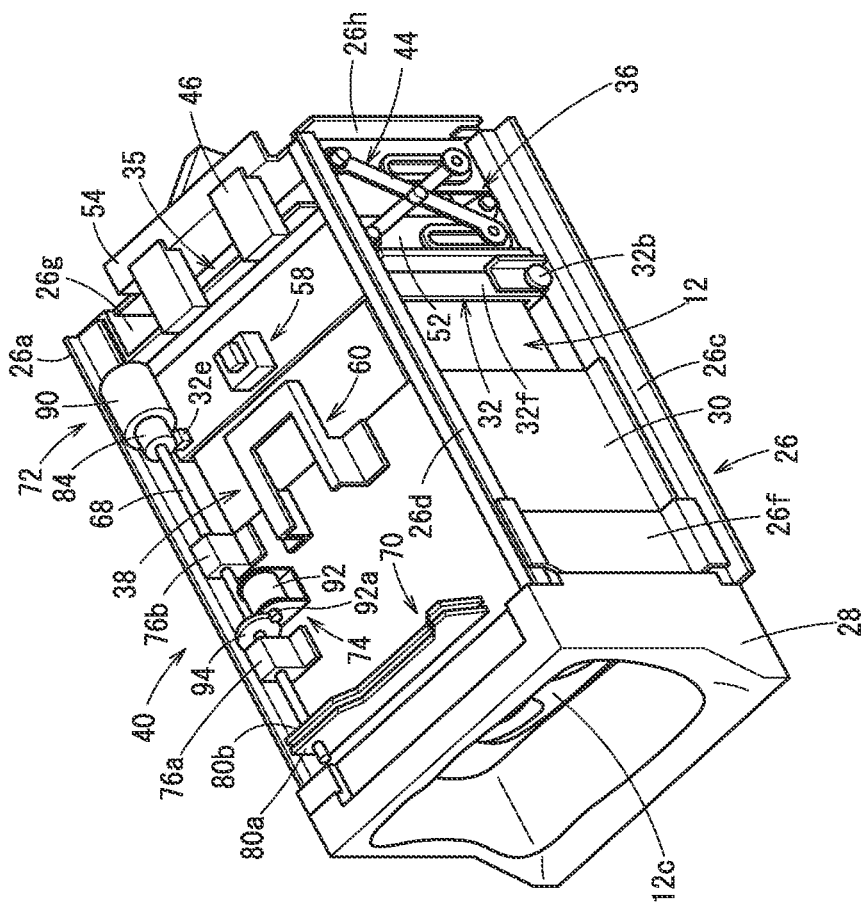
FIG. 8 is a diagram showing a state in which the mobile battery is stored in the slot.

FIGS. 6, 7, and 8 each show a state in which the mobile battery 12 is housed in the slot 14. When housing the mobile battery 12 in the slot 14, the user grips a handle 12c of the mobile battery 12 and inserts the mobile battery 12 into the insertion port 28 (FIG. 6). Then, in a state where the entire mobile battery 12 has been inserted into the slot 14 (FIG. 7), the user further presses on the mobile battery 12 (FIG. 8). Due to this, the battery tray 32 moves toward the negative Z-axis direction side along with the mobile battery 12, and the connector 12b of the mobile battery 12 becomes connected to the connector 34. In the following, the state of the slot 14 shown in FIG. 7 can be used to describe a state in which the mobile battery 12 has been inserted into the slot 14. Furthermore, the state of the slot 14 shown in FIG. 8 can be used to describe a state in which the mobile battery 12 has been pressed into the slot 14.

Tray Lock Mechanism

The tray lock mechanism 38 allows movement of the battery tray 32 toward the negative Z-axis direction side in a state where the mobile battery 12 is inserted into the slot 14, but restricts movement of the battery tray 32 toward the negative Z-axis direction side in a state where the mobile battery 12 is not inserted into the slot 14.

Figure 9:
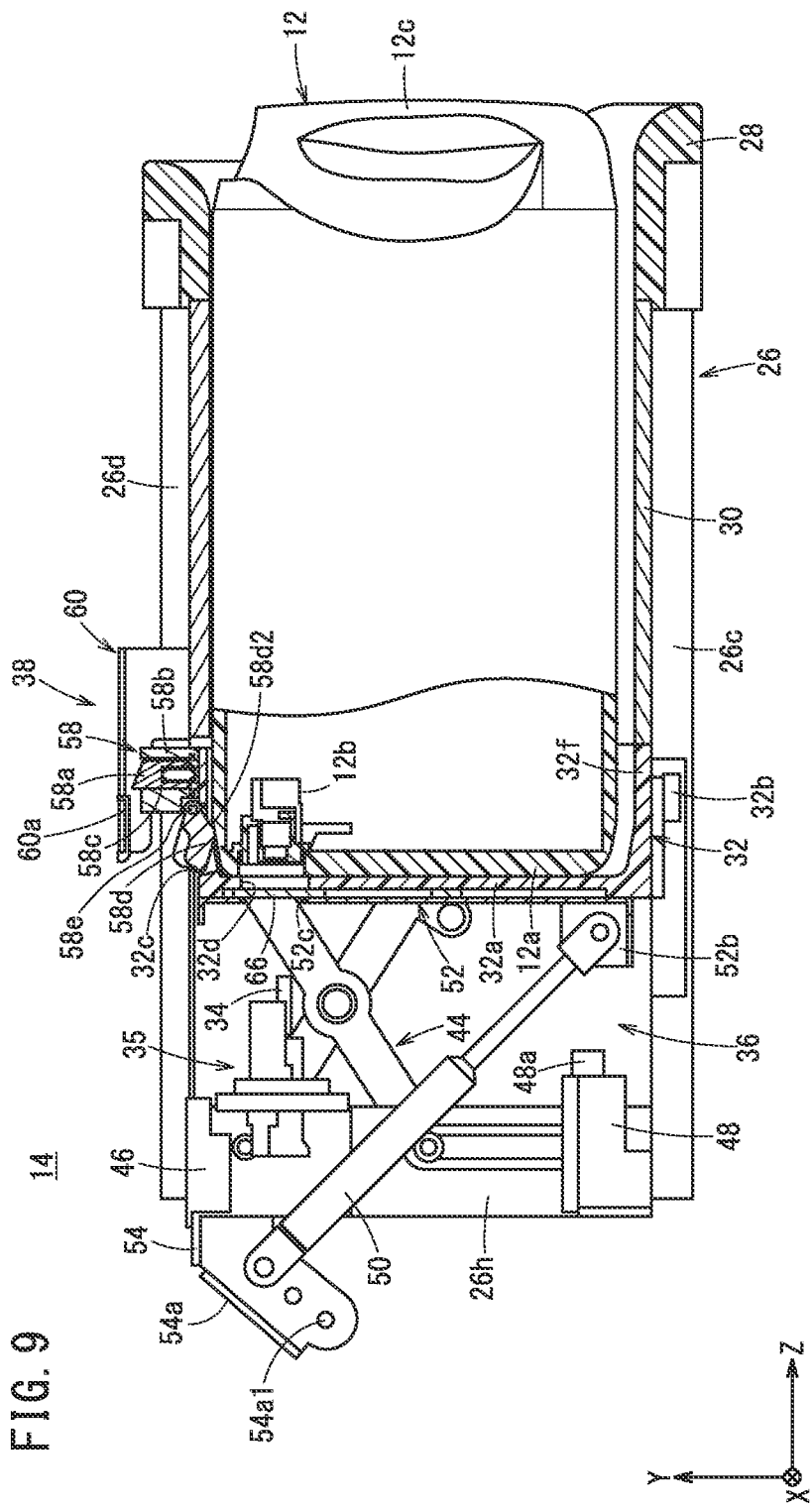
FIG. 9 is a cross-sectional view of the slot.

FIG. 9 is a cross-sectional view of the slot 14. The slot 14 shown in FIG. 9 is cut along a plane parallel to the YZ-plane. FIG. 9 shows a state in which the mobile battery 12 has been inserted into the slot 14. In FIG. 9, a partial cross-sectional view of the mobile battery 12 is shown. The tray lock mechanism 38 is installed on the side surface of the slot 14 on the positive Y-axis direction side. The tray lock mechanism 38 includes a latch 58 and a strike 60.

The latch 58 is installed on the side surface of the tray body 32f of the battery tray 32 on the positive Y-axis direction side. The latch 58 includes a latch bolt 58a, a latch bolt holder 58b, a spring 58c, and a lever 58d. The latch bolt 58a is provided movably in the Y-axis direction, inside the latch bolt holder 58b that is fixed to the battery tray 32. The latch bolt 58a is biased toward the positive Y-axis direction side by the spring 58c provided inside the latch bolt holder 58b. The positive Z-axis direction side end portion of the lever 58d is connected to the latch bolt 58a, and the negative Z-axis direction side end portion of the lever 58d is provided extending into the battery tray 32 through a through-hole 32c formed in the side surface of the battery tray 32 on the positive Y-axis direction side. The lever 58d is provided to be pivotable relative to the latch bolt holder 58b, about a pivot shaft 58e fixed to the latch bolt holder 58b, at a central portion of the lever 58d in the Z-axis direction.

The strike 60 is fixed to the surface of the battery holder 30 on the positive Y-axis direction side. As shown in FIG. 4, the strike 60 is formed extending from the battery holder 30 toward the negative Z-axis direction side, beyond the end portion of the battery holder 30, and includes, at the negative Z-axis side end portion thereof, a locking portion 60a that extends in the X-axis direction. In a state where the battery tray 32 has moved as far as possible to the positive Z-axis direction side, in other words, a state where the battery tray 32 contacts the side surface of the battery holder 30 on the negative Z-axis direction side, the latch bolt 58a is positioned farther on the positive Z-axis direction side than the locking portion 60a of the strike 60.

In a state where the latch bolt 58a of the latch 58 is positioned farther on the positive Z-axis direction side than the locking portion 60a of the strike 60 and the tip of the latch bolt 58a on the positive Y-axis direction side is positioned farther on the positive Y-axis direction side than the locking portion 60a (i.e. a locked state), the tray lock mechanism 38 restricts the movement of the battery tray 32 toward the negative Z-axis direction side. In a state where the tip of the latch bolt 58a of the latch 58 on the positive Y-axis direction side is positioned farther on the negative Y-axis direction side than the locking portion 60a of the strike 60 (i.e. an unlocked state), the tray lock mechanism 38 allows the movement of the battery tray 32 toward the negative Z-axis direction side.

Figure 10:
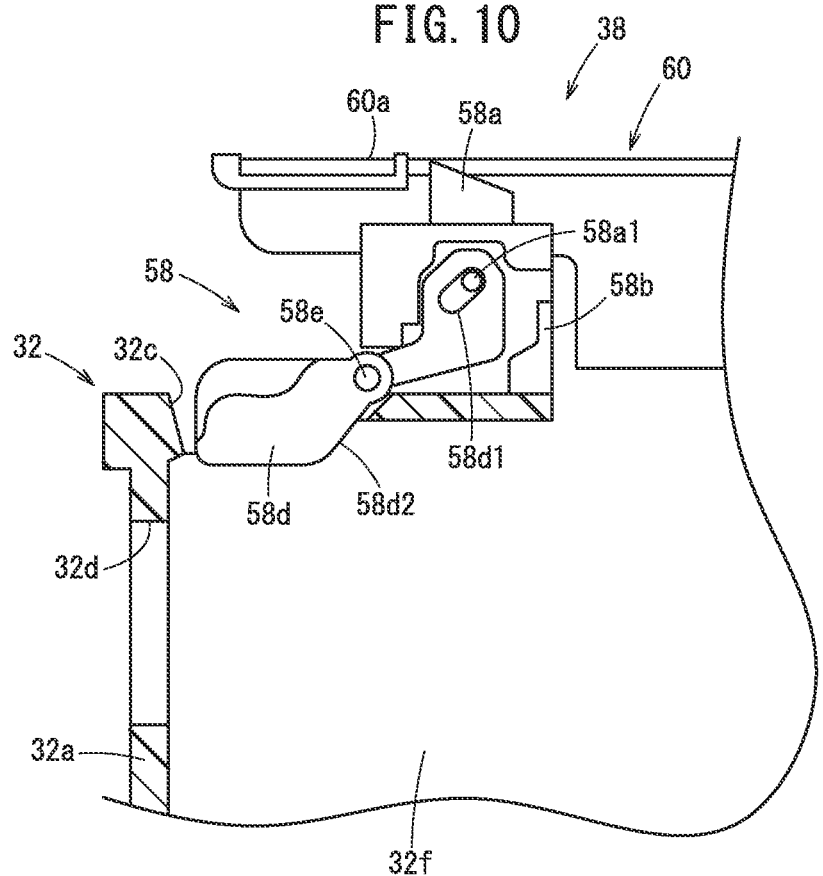
FIG. 10 is a cross-sectional view of a tray lock mechanism in the locked state.

FIG. 10 is a cross-sectional view of the tray lock mechanism 38 in the locked state. FIG. 11 is a cross-sectional perspective view of the tray lock mechanism 38 in the locked state. The tray lock mechanism 38 shown in FIGS. 10 and 11 is cut along a plane parallel to the YZ-plane.

The latch bolt 58a includes a connection shaft 58a1 that penetrates through the latch bolt holder 58b in the X-axis direction and extends to the outside of the latch bolt holder 58b. A long hole 58d1 is formed in the positive Z-direction side end portion of the lever 58d, and the connection shaft 58a1 of the latch bolt 58a is inserted into this long hole 58d1 on the outer side of the latch bolt holder 58b.

As shown in FIG. 10, the portion of the lever 58d positioned inside the battery tray 32 has an inclined surface 58d2 on the positive Z-axis direction side thereof. When viewed from the negative X-axis direction side, this inclined surface 58d2 is formed to be positioned farther inside the battery tray 32, toward the negative Z-axis direction side.

Figure 12:
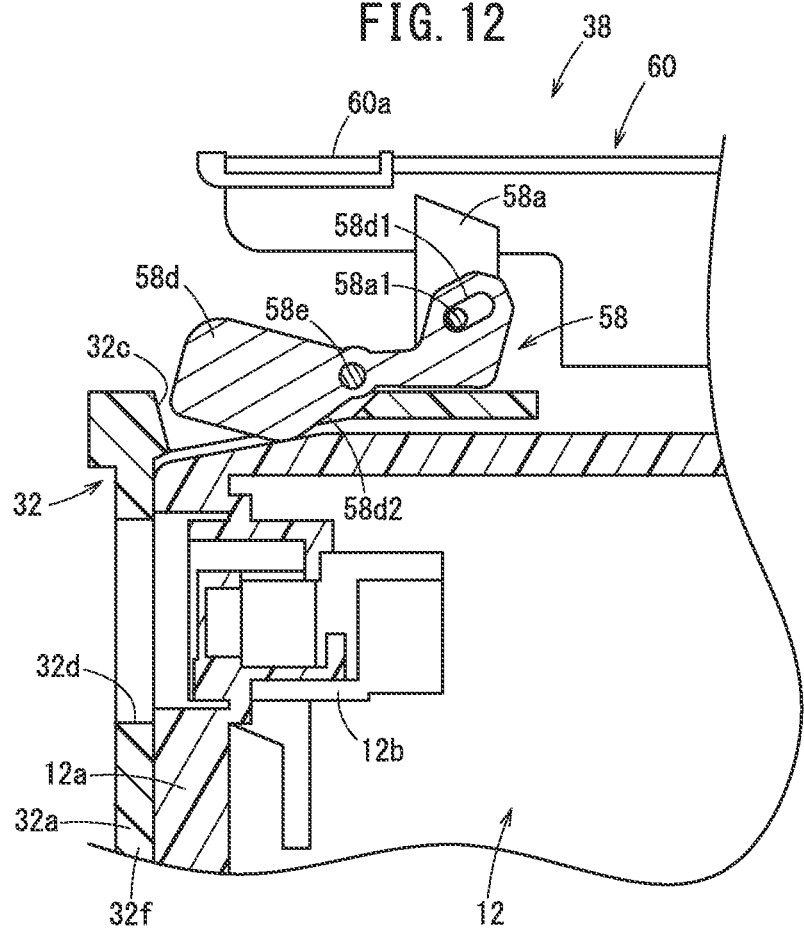
FIG. 12 is a cross-sectional view of the tray lock mechanism in the unlocked state.
Figure 13:
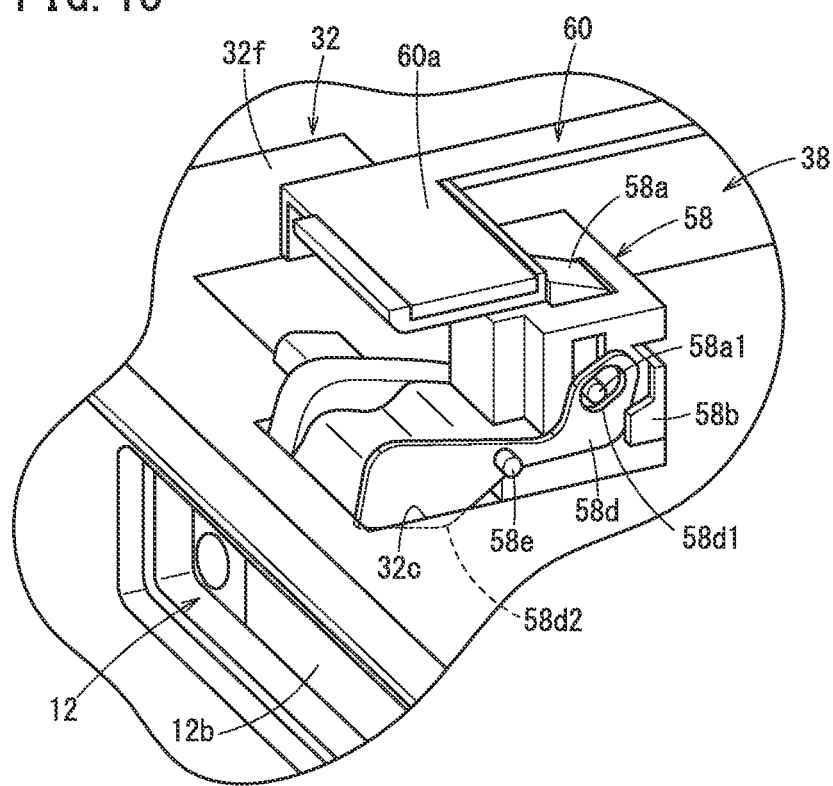
FIG. 13 is a perspective cross-sectional view of the tray lock mechanism in the unlocked state.

FIG. 12 is a cross-sectional view of the tray lock mechanism 38 in the unlocked state. FIG. 13 is a cross-sectional perspective view of the tray lock mechanism 38 in the unlocked state. The tray lock mechanism 38 shown in FIGS. 12 and 13 is cut along a plane parallel to the YZ-plane.

As shown in FIG. 12, when the mobile battery 12 is inserted in the slot 14, the side surface of the lever 58d that is on the negative Z-axis direction side of the pivot shaft 58e and also on the negative Y-axis direction side of the pivot shaft 58e is pushed toward the positive Y-axis direction side, and the lever 58d pivots about the pivot shaft 58e. Due to this, the portion of the lever 58d that is on the positive Z-axis direction side of the pivot shaft 58e moves toward the negative Y-axis direction side, and the connection shaft 58a1 of the latch bolt 58a is pulled toward the negative Y-axis direction side. As a result, the latch bolt 58a moves toward the negative Y-axis direction side, and the positive Y-axis direction side end portion of the latch bolt 58a is positioned farther on the negative Y-axis direction side than the locking portion 60a of the strike 60.

As described above, in a state where the battery tray 32 is in contact with the side surface of the battery holder 30 on the negative Z-axis direction side, the latch bolt 58a is positioned farther on the positive Z-axis direction side than the locking portion 60a of the strike 60. In other words, in a state where the battery tray 32 is positioned as far as possible on the positive Z-axis direction side, the latch bolt 58a and the locking portion 60a are not in contact with each other. Therefore, even in a case where the battery tray 32 rattles against the battery holder 30, excessive force does not act on the latch 58 and the strike 60.

The tray lock mechanism 38 has a function of preventing upside-down insertion of the mobile battery 12. The user needs to insert the mobile battery 12 into the slot 14 in a state where a prescribed side surface of the mobile battery 12 is facing upward. This is necessary in order to align the position of the connector 34 of the slot 14 and the position of the connector 12b of the mobile battery 12. Were the slot 14 to not include the tray lock mechanism 38, when the user inserts the mobile battery 12 upside-down into the slot 14 and then presses on the mobile battery 12, not only would the connector 12b of the mobile battery 12 not connect to the connector 34 of the slot 14, but there would also be a concern that a large force would act on the connector 34 of the slot 14. In a case where the mobile battery 12 is inserted upside-down into the slot 14, the tray lock mechanism 38 remains in the locked state and restricts the movement of the battery tray 32 in the Z-axis direction.

FIGS. 14A and 14B are schematic views of the insertion port 28, the battery holder 30, the battery tray 32, and the mobile battery 12, seen from the positive Z-axis direction side. The inner circumferential surfaces of the insertion port 28, the battery holder 30, and the battery tray 32 are formed to have substantially the same shape, as seen from the positive Z-axis direction side. FIG. 14A shows a state in which the mobile battery 12 is facing the correct direction and is inserted into the slot 14 with the correct posture. FIG. 14B shows a state in which the mobile battery 12 is upside-down and is inserted into the slot 14 with an incorrect posture.

Among the four side surfaces of the mobile battery 12 excluding the surface provided with the handle 12c and the bottom surface 12a provided with the connector 12b, one side surface S1 is formed as a substantially flat surface, and a side surface S2 opposing the side surface S1 is formed as a curved surface protruding outward. A state in which the side surface S2 of the mobile battery 12 faces upward is the correct state when inserting the mobile battery 12 into the slot 14.

As shown in FIG. 14B, a side surface S3, which is on the negative Y-axis direction side of the insertion port 28, the battery holder 30, and the battery tray 32, is formed with a shape following the curved surface of the side surface S2 of the mobile battery 12. In the case where the mobile battery 12 is inserted into the slot 14 in the state shown in FIG. 14B, the mobile battery 12 is positioned on the negative Y-axis direction side compared to the case where the mobile battery 12 is inserted into the slot 14 in the state shown in FIG. 14A.

Therefore, the size of the gap on the positive Y-axis direction side between the mobile battery 12 and the insertion port 28, battery holder 30, and battery tray 32 is greater in the case where the mobile battery 12 is inserted into the slot 14 in the state shown in FIG. 14B than in the case where the mobile battery 12 is inserted into the slot 14 in the state shown in FIG. 14A (G1<G2).

As shown in FIG. 10, the lever 58d of the latch 58 of the tray lock mechanism 38 is provided in a manner to extend through the through-hole 32c on the positive Y-axis direction side of the battery tray 32 to the inner side of the inner circumferential surface of the battery tray 32. Therefore, in a case where the mobile battery 12 is inserted upside-down into the slot 14 as shown in FIG. 14B, the side surface S1 of the mobile battery 12 does not contact the lever 58d of the latch 58, and the tray lock mechanism 38 does not enter the unlocked state. Due to this, the user cannot press in the mobile battery 12, and therefore it is possible to prevent upside-down insertion of the mobile battery 12.

Tray Holding Mechanism

Figure 15:
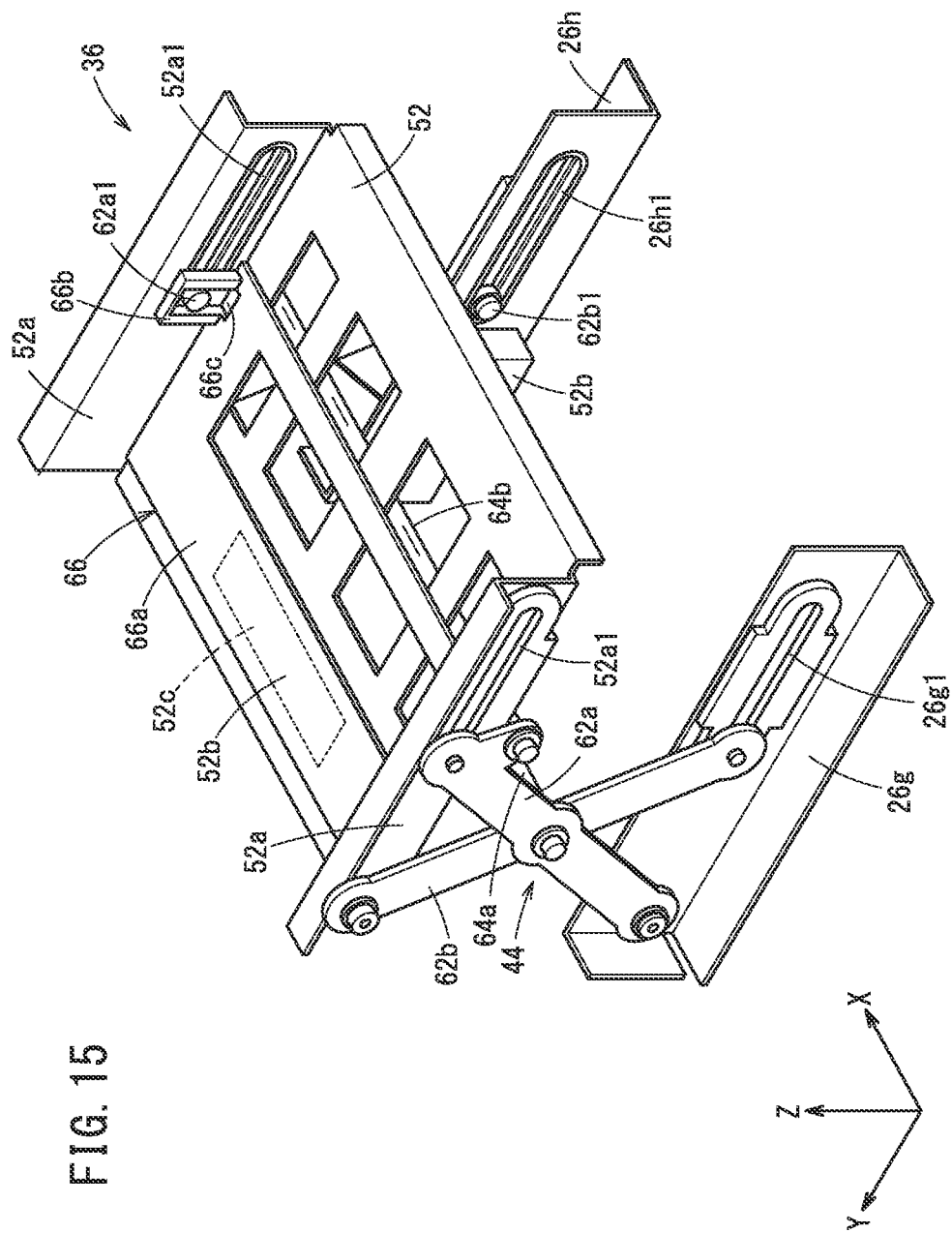
FIG. 15 is a perspective view of an X-link of a tray holding mechanism.

FIG. 15 is a perspective view of X-links 44 of the tray holding mechanism 36. Each X-link 44 includes two links 62a and 62b. The negative Z-axis direction side end portions of the links 62a are attached respectively to the positive Y-axis direction side end portions of the side frame 26g and the side frame 26h. The positive Z-axis direction side end portion of each link 62a is provided with a pin 62a1 extending to the inner side of the slot 14 in the X-axis direction. The pin 62a1 is inserted into a guide 52a1 formed in a side surface 52a of the tray bracket 52. The guide 52a1 is formed as a long hole extending in the Y-axis direction, and the positive Z-axis direction side end portion of each link 62a is guided in the Y-axis direction along the guide 52a1. The positive Z-axis direction side end portion of each link 62b is attached to the positive Y-axis direction side end portion of the side surface 52a of the tray bracket 52. The negative Z-axis direction side end portion of each link 62b is provided with a pin 62b1 extending to the inner side of the slot 14 in the X-axis direction. The pins 62b1 are inserted into guides 26g1 and 26h1 formed respectively in the side frames 26g and 26h. The guides 26g1 and 26h1 are formed as long holes extending in the Y-axis direction, and the negative Z-axis direction side end portions of the links 62b are guided in the Y-axis direction along the guides 26g1 and 26h1.

The link 62a and the link 62b are connected in a manner to be pivotable relative to each other about a common pivotal axis, near the centers thereof in the longitudinal direction. With respect to the tray bracket 52, the link 62a and the link 62b arranged in the X-link 44 on the negative X-axis direction side and the link 62a and the link 62b arranged in the X-link 44 on the positive X-axis direction side are coupled to each other by a rod 64a along the pivotal axis. Furthermore, with respect to the tray bracket 52, the positive Z-axis direction side end portion of the link 62a of the X-link 44 arranged on the negative X-axis direction side and the positive Z-axis direction side end portion of the link 62a of the X-link 44 arranged on the positive X-axis direction side are coupled to each other by a rod 64b. The strength of the X-links 44 with respect to force in the X-axis direction can be ensured by the rod 64a and the rod 64b.

As shown in FIG. 9, a through-hole 32d is formed in the positive Y-axis direction side of the bottom portion 32a of the tray body 32f of the battery tray 32. A through-hole 52c is formed in the tray bracket 52, at a position corresponding to the through-hole 32d of the tray body 32f. A shutter 66 is arranged between the bottom portion 32a of the tray body 32f and the tray bracket 52.

As shown in FIG. 15, the shutter 66 includes a body portion 66a and joining portions 66b. The body portion 66a is a member shaped as a flat plate, and a thinning process is performed on a portion of the body portion 66a on the negative Y-axis direction side. Due to this, the shutter 66 can be made lightweight. It should be noted that the body portion 66a does not need to undergo the thinning process. The joining portions 66b are formed on the negative Y-axis direction side end portion of the body portion 66a on respective X-axis direction sides. Each joining portion 66b is formed protruding to the positive Z-axis direction side. The joining portion 66b is substantially U-shaped, and is joined to the body portion 66a at locations corresponding to the end portions of the U shape. Notches 66c are formed in the parts of the body portion 66a where the joining portions 66b are formed.

Figure 16:
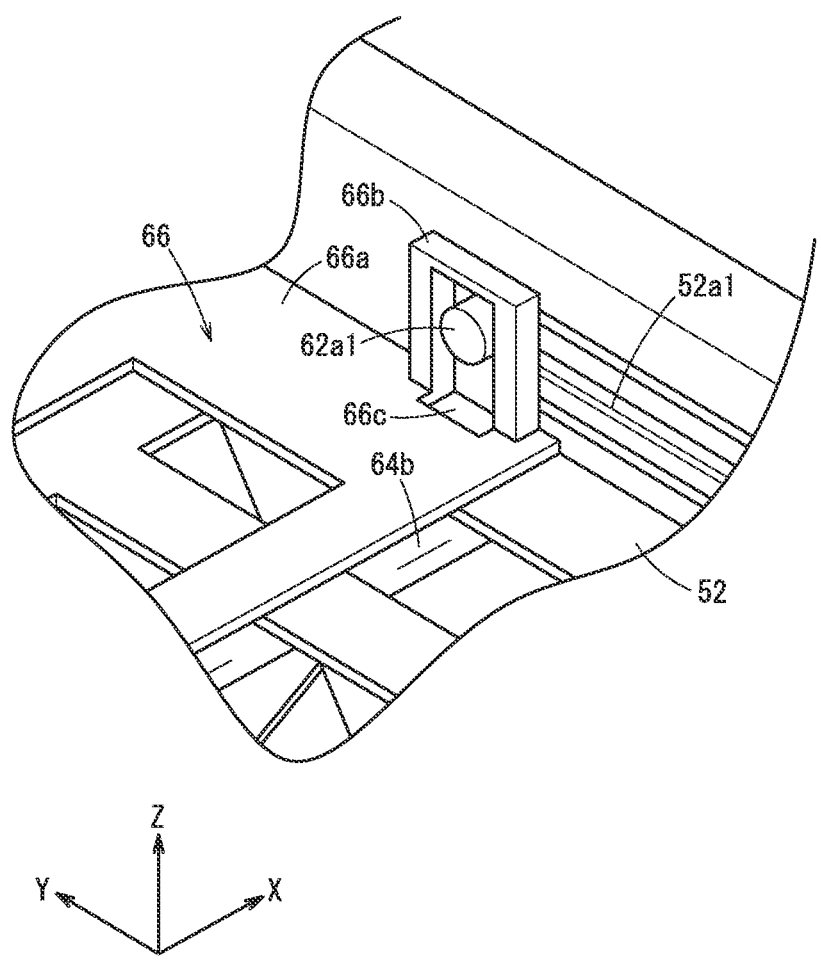
FIG. 16 is an enlarged view of the region near a joining portion of a shutter.

FIG. 16 is an enlarged view of the region near the joining portion 66b of the shutter 66. As shown in FIG. 16, in the shutter 66, the pin 62a1 of the link 62a is inserted into the joining portion 66b from the negative Z-axis direction side, to connect the joining portion 66b and the link 62a. Due to this, the shutter 66 can move in the Y-axis direction along with the link 62a.

Figure 17:
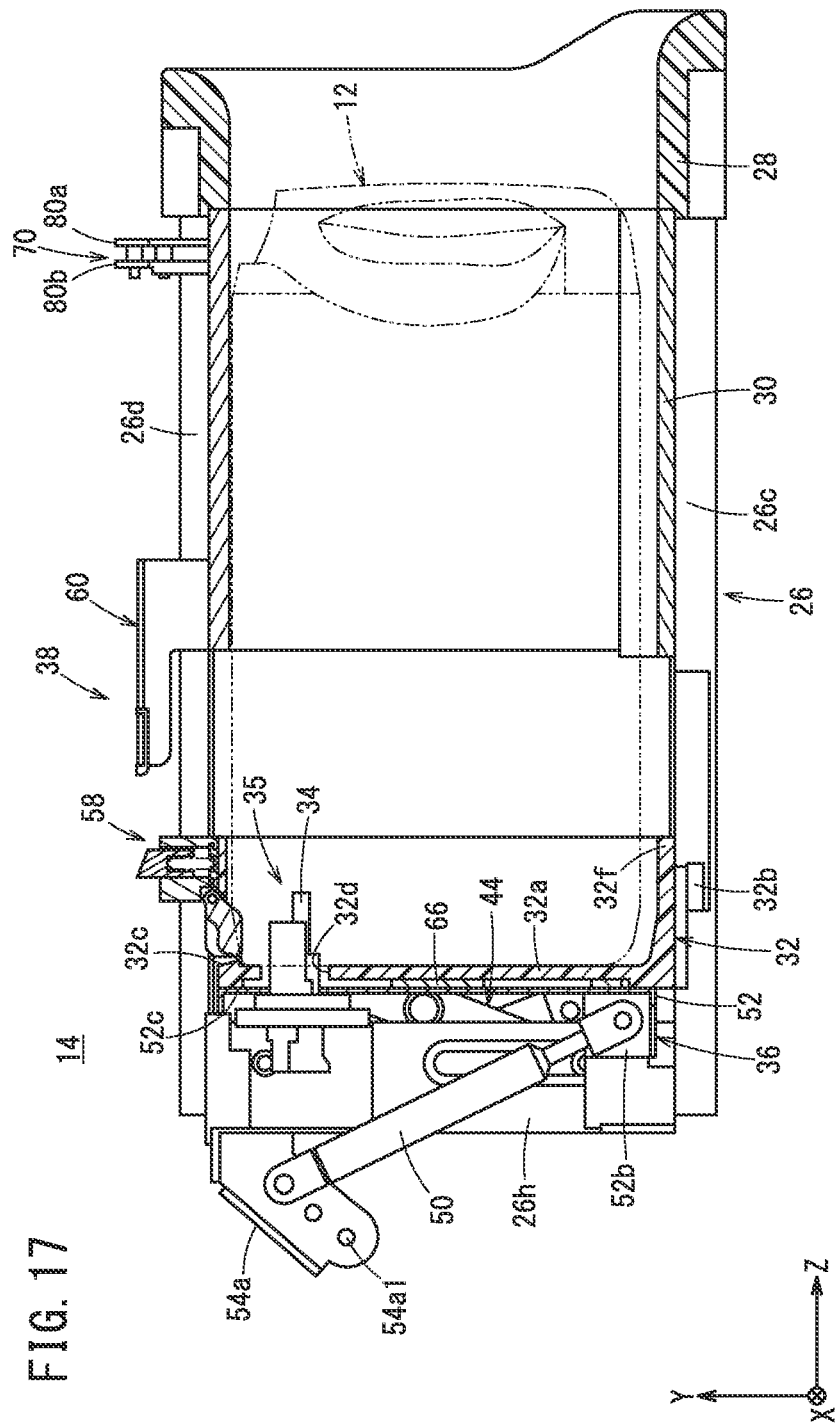
FIG. 17 is a cross-sectional view of the slot.
Figure 18:
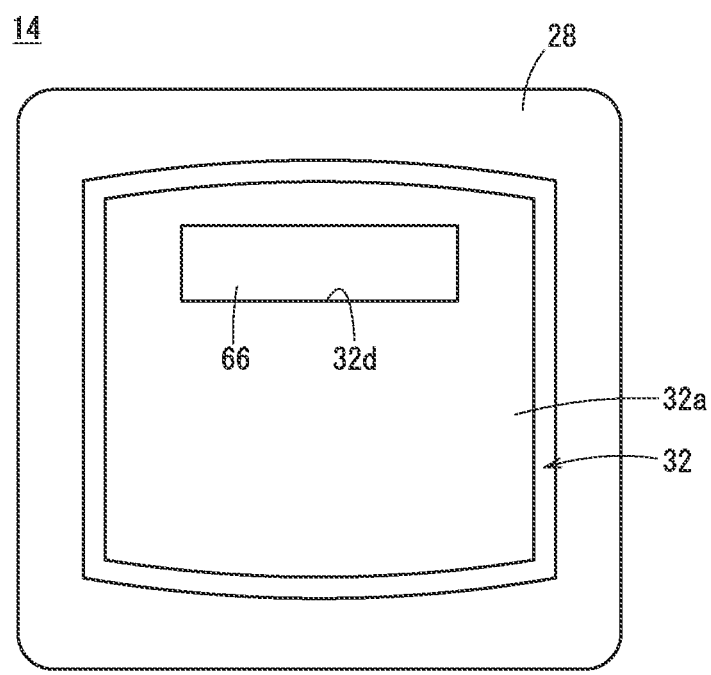
FIG. 18 is a front view of the slot.

FIG. 17 is a cross-sectional view of the slot 14. The slot 14 shown in FIG. 17 is cut along a plane parallel to the YZ-plane. FIG. 17 shows the slot 14 in a state where the battery tray 32 is positioned as far as possible to the negative Z-axis direction side. In FIG. 17, in order to more easily see the connector 34 and the like, the contour of the mobile battery 12 is shown by a two-dot chain line. FIGS. 18 and 19 are front views of the slot 14. FIG. 18 shows the slot 14 in a state where the battery tray 32 is positioned as far as possible on the positive Z-axis direction side. FIG. 19 shows the slot 14 in a state where the battery tray 32 is positioned as far as possible on the negative Z-axis direction side. The state in which the battery tray 32 is positioned as far as possible on the positive Z-axis direction side indicates a state where the battery tray 32 is in contact with the negative Z-axis direction side end surface of the battery holder 30. Furthermore, the state in which the battery tray 32 is positioned as far as possible on the negative Z-axis direction side indicates a state where the battery tray 32 is in contact with the stoppers 46.

As shown in FIGS. 17 to 19, the shutter 66 moves in the Y-axis direction along with the link 62a, in accordance with the movement of the tray bracket 52 in the Z-axis direction. When the battery tray 32 is positioned on the positive Z-axis direction side, the shutter 66 blocks off the communication between the through-hole 52c of the tray bracket 52 and the through-hole 32d of the tray body 32f. Due to this, it is possible to suppress the intrusion of foreign matter into the connector 34 side from the battery tray 32 side. When the battery tray 32 moves to the negative Z-axis direction side, the shutter 66 opens and communication is established between the through-hole 52c of the tray bracket 52 and the through-hole 32d of the tray body 32f. Then, the connector 34 is inserted through the through-hole 52c of the tray bracket 52 and the through-hole 32d of the battery tray 32 to enter inside the battery tray 32. Due to this, the connector 34 of the slot 14 is connected to the connector 12b of the mobile battery 12 held by the battery tray 32.

The gas spring 50 of the tray holding mechanism 36 has gas sealed therein, and has a damper function of generating a damping force that hinders displacement of the tray bracket 52 in the Z-axis direction and a spring function of biasing the tray bracket 52 toward the positive Z-axis direction side. When the battery tray 32 receives the load of the mobile battery 12 and moves to the negative Z-axis direction side, the gas spring 50 accumulates energy. Furthermore, when the battery tray 32 moves to the positive Z-axis direction side, the gas spring 50 releases the accumulated energy. The gas spring 50 accumulates the energy as the pressure of the gas sealed therein. Instead of the gas spring 50, a metal spring may be used. In such a case, the energy is accumulated as elastic force of the spring. The slot 14 is installed with different inclinations depending on the type of the battery exchanger 10. The force acting in the Z-axis direction on the battery tray 32 from the mobile battery 12 changes according to the inclination at which the slot 14 is installed in the battery exchanger 10. Therefore, the damper load of the gas spring 50 needs to be set according to the inclination at which the slot 14 is installed in the battery exchanger 10.

As shown in FIG. 9, three attachment holes 54a1 are formed in the spring bracket 54a that holds the gas spring 50. By changing the attachment hole 54a1 that the gas spring 50 is attached to, it is possible to change the inclination of the gas spring 50 relative to the Z-axis direction. The damper load acting on the battery tray 32 from the gas spring 50 becomes larger as the inclination of the gas spring 50 relative to the Z-axis direction becomes smaller. Due to this, even with just one type of gas spring 50, it is possible to change the damper load acting on the battery tray 32 from the gas spring 50.

Accordingly, there is no need to prepare the gas spring 50 corresponding to the inclination at which the slot 14 is installed in the battery exchanger 10, for each type of battery exchanger 10.

The air damper 48 of the tray holding mechanism 36 generates a damping force to hinder the displacement of the tray bracket 52 toward the negative Z-axis direction side. As shown in FIG. 3, the air damper 48 includes a plunger 48a shaped as a circular pillar. When the tray bracket 52 has moved to the negative Z-axis direction side, the tray bracket 52 contacts the plunger 48a, a damping force acts in the positive Z-axis direction on the tray bracket 52 from the plunger 48a, and the air damper 48 absorbs the force input from the tray bracket 52.

The stoppers 46 of the tray holding mechanism 36 restrict the movement of the battery tray 32 toward the negative Z-axis direction side. When the battery tray 32 has moved as far as possible toward the negative Z-axis direction side, the tray bracket 52 contacts the stoppers 46. Due to this, the movement of the battery tray 32 toward the negative Z-axis direction side is restricted, and therefore it is possible to prevent an excessive force from acting on the connector 34 from the mobile battery 12.

Battery Lock Mechanism

The battery lock mechanism 40 restricts the movement of the mobile battery 12 toward the positive Z-axis direction side, in a state where the mobile battery 12 has been pressed into the slot 14. Due to this, the mobile battery 12 remains in the state of being pressed into the slot 14.

Figure 20:
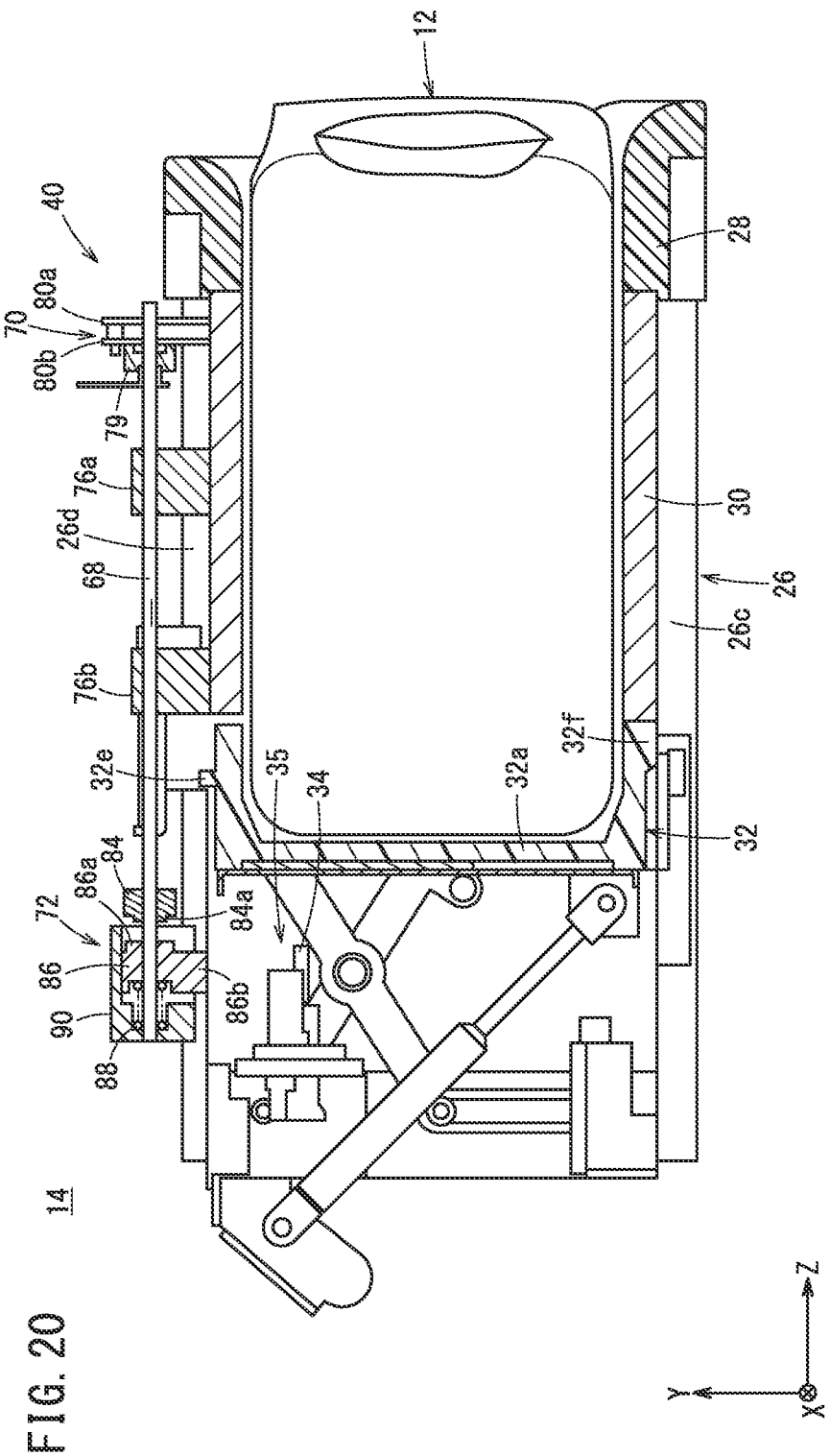
FIG. 20 is a cross-sectional view of the slot.
Figure 21:
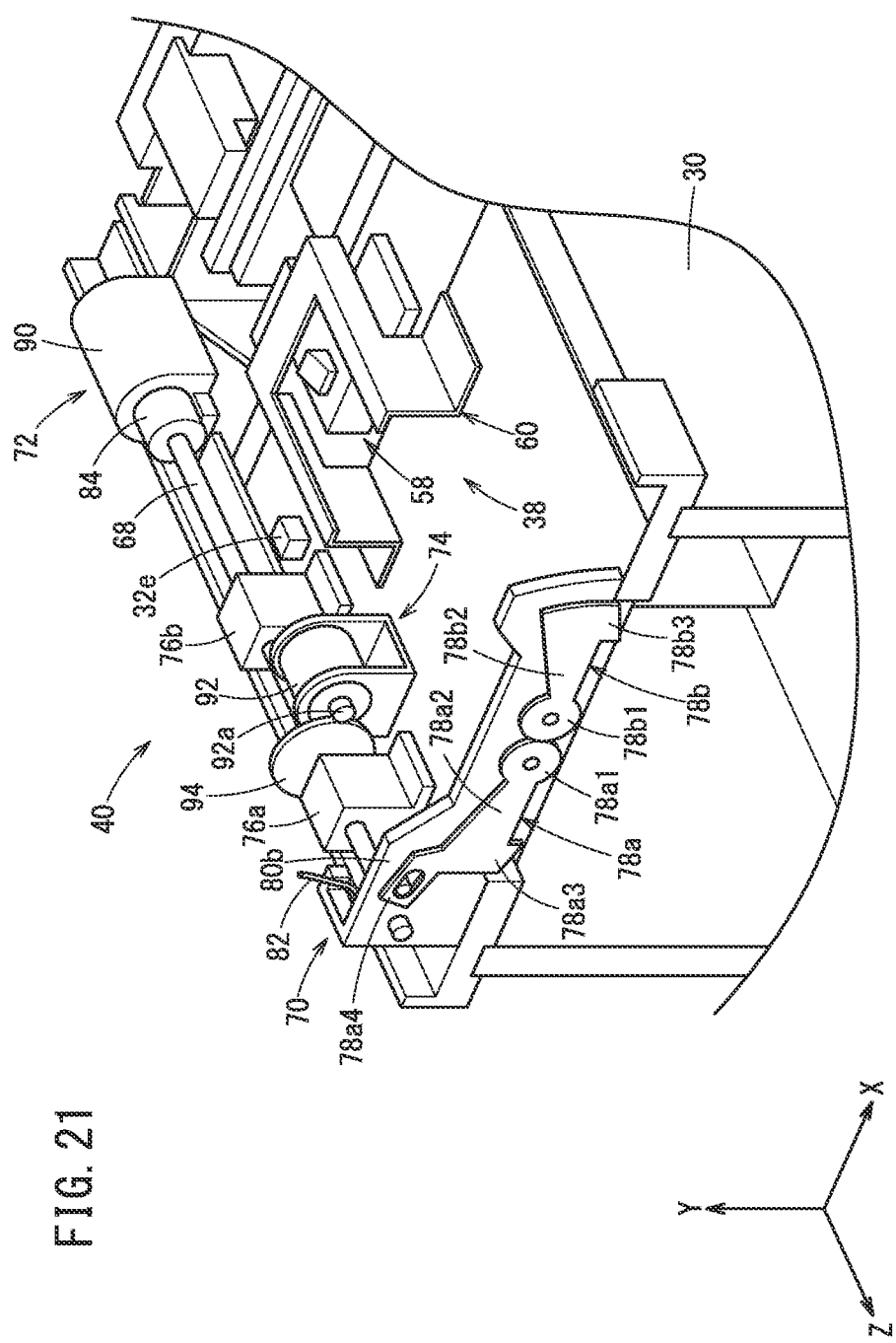
FIG. 21 is an enlarged perspective view of a battery lock mechanism.
Figure 22:
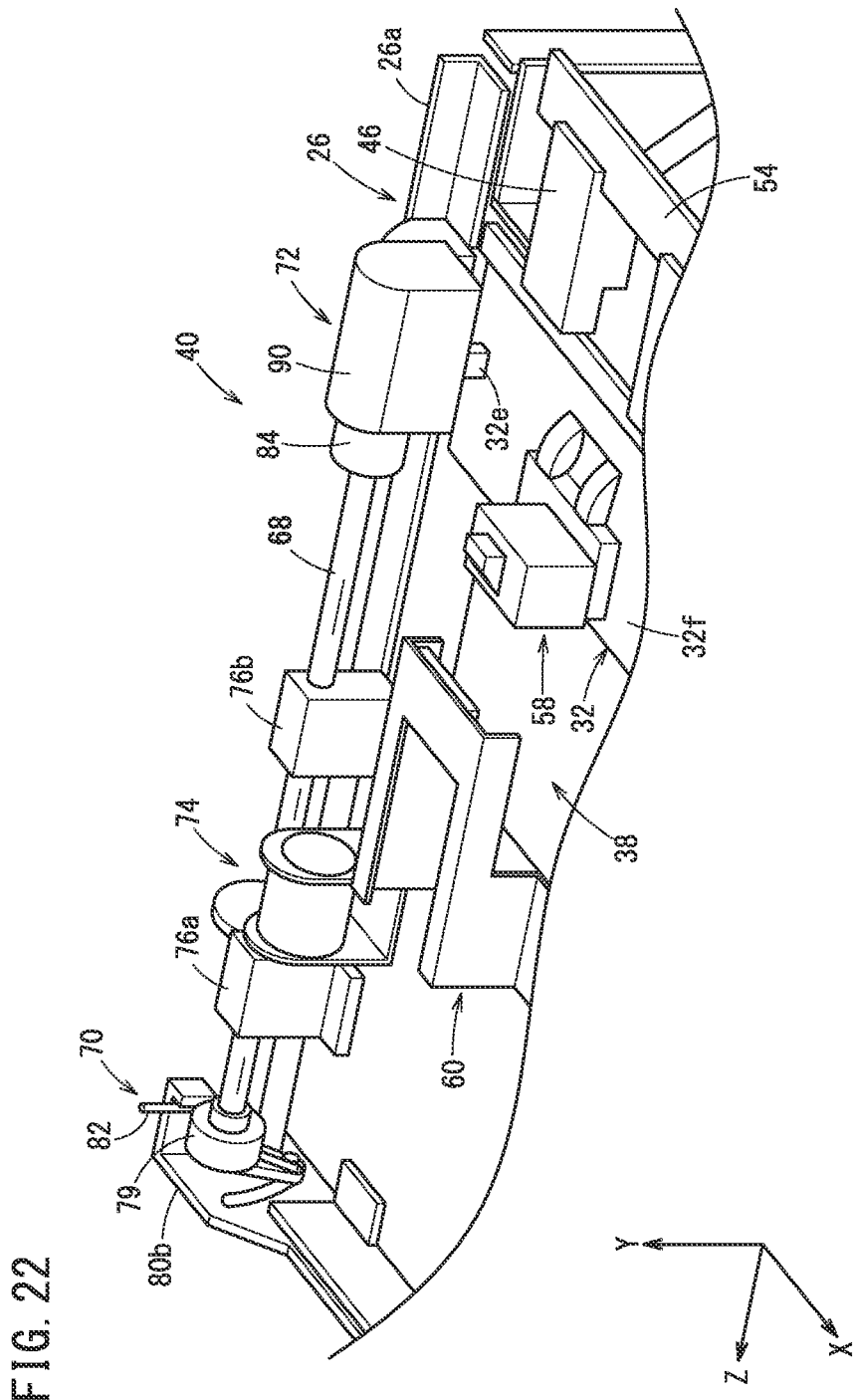
FIG. 22 is an enlarged perspective view of the battery lock mechanism.

FIG. 20 is a cross-sectional view of the slot 14. The slot 14 shown in FIG. 20 is cut along a plane parallel to the YZ-plane. FIGS. 21 and 22 are enlarged perspective views of the battery lock mechanism 40. FIG. 21 shows a state in which the mobile battery 12 is not inserted into the slot 14.

FIG. 22 shows a state in which the mobile battery 12 has been pressed into the slot 14.

The battery lock mechanism 40 is installed on the side surface of the slot 14 on the positive Y-axis direction side. The battery lock mechanism 40 includes a shaft 68, a stopper driving portion 70, a stopper locking portion 72, and a stopper lock releasing portion 74.

The shaft 68 is disposed to extend in the Z-axis direction. The shaft 68 is rotatably supported by two bearings 76a and 76b installed on the side surface of the battery holder 30 on the positive Y-axis direction side.

The stopper driving portion 70 includes flaps 78a and 78b, a lever 79, and a torsion spring 82. The flaps 78a and 78b are arranged between a plate 80a and a plate 80b installed on the side surface of the battery holder 30 on the positive Y-axis direction side. The flaps 78a and 78b respectively include gears 78a1 and 78b1 having teeth formed along the outer circumferences thereof. The flaps 78a and 78b are rotatably attached to the plates 80a and 80b at the rotation center of the gears 78a1 and 78b1. The gear 78a1 of the flap 78a and the gear 78b1 of the flap 78b engage with each other. The flaps 78a and 78b respectively include arms 78a2 and 78b2 extending from the gears 78a1 and 78b1, and stoppers 78a3 and 78b3 extending toward the negative Y-axis direction side of the battery holder 30 from the arms 78a2 and 78b2.

The lever 79 is attached to the shaft 68, and the lever 79 and the shaft 68 rotate integrally. The torsion spring 82 is provided between the lever 79 and the plate 80b. When viewed from the positive Z-axis direction side, the torsion spring 82 biases the lever 79 to rotate clockwise about the shaft 68. The lever 79 is joined to a joining portion 78a4 of the flap 78a. The flap 78a rotates centered on the gear 78a1 due to the rotation of the lever 79, the gear 78b1 of the flap 78b engaging with the gear 78a1 rotates, and the entire flap 78b rotates centered on the gear 78b1.

Figure 23:
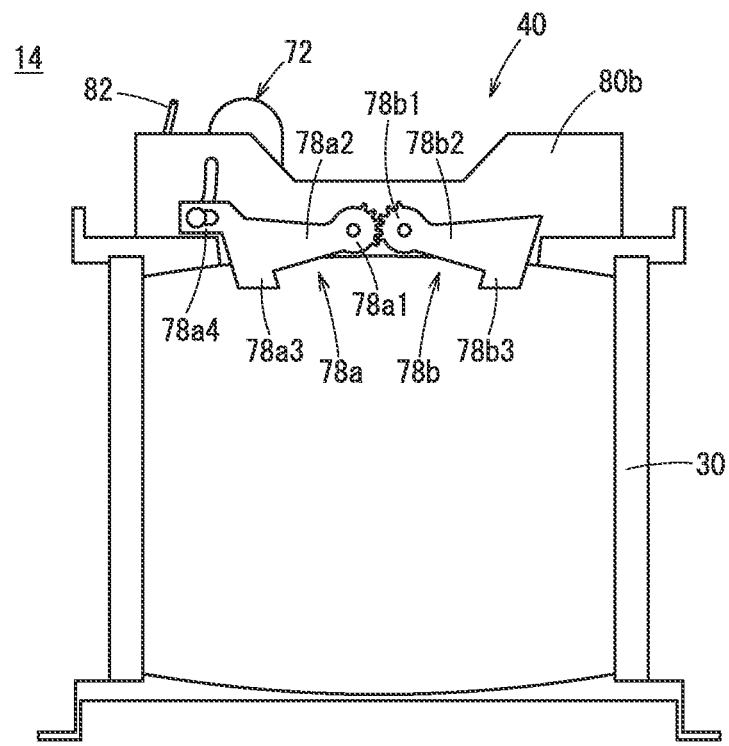
FIG. 23 is a cross-sectional front view of the slot.
Figure 24:
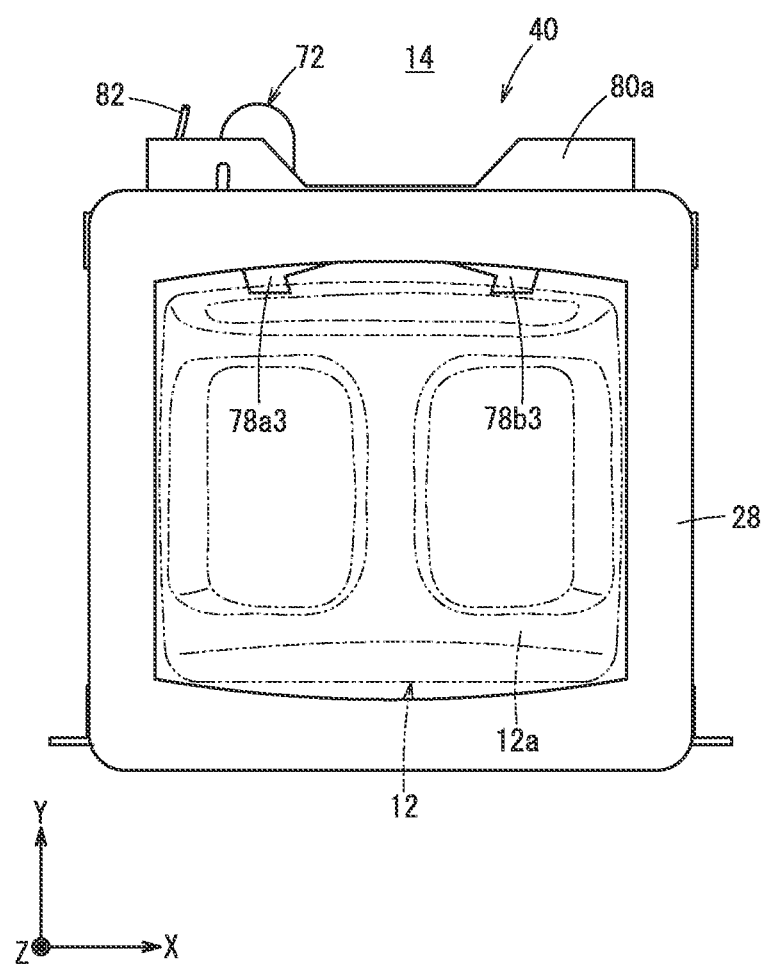
FIG. 24 is a front view of the slot.

FIG. 23 is a cross-sectional front view of the slot 14. The slot 14 shown in FIG. 23 is cut along a plane parallel to the XY-plane. FIG. 24 is a front view of the slot 14. FIGS. 23 and 24 show the flaps 78a and 78b in a lowered state.

As viewed from the positive Z-axis direction side, when the shaft 68 rotates clockwise along with the lever 79, the stoppers 78a3 and 78b3 of the flaps 78a and 78b move to the inner side of the battery holder 30. Due to this, when the mobile battery 12 is pulled out from the slot 14, the mobile battery 12 is caught on the stoppers 78a3 and 78b3 and the movement of the mobile battery 12 toward the positive Z-axis direction side is restricted.

Figure 25:
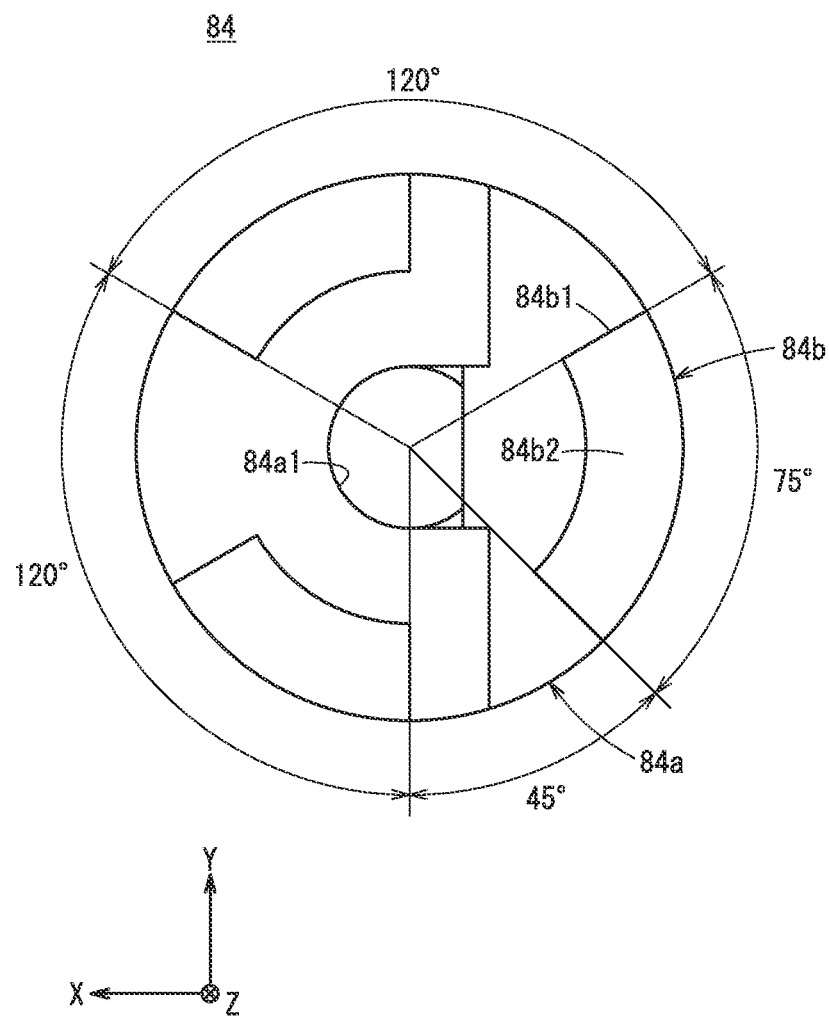
FIG. 25 is front view of a cam.
Figure 26:
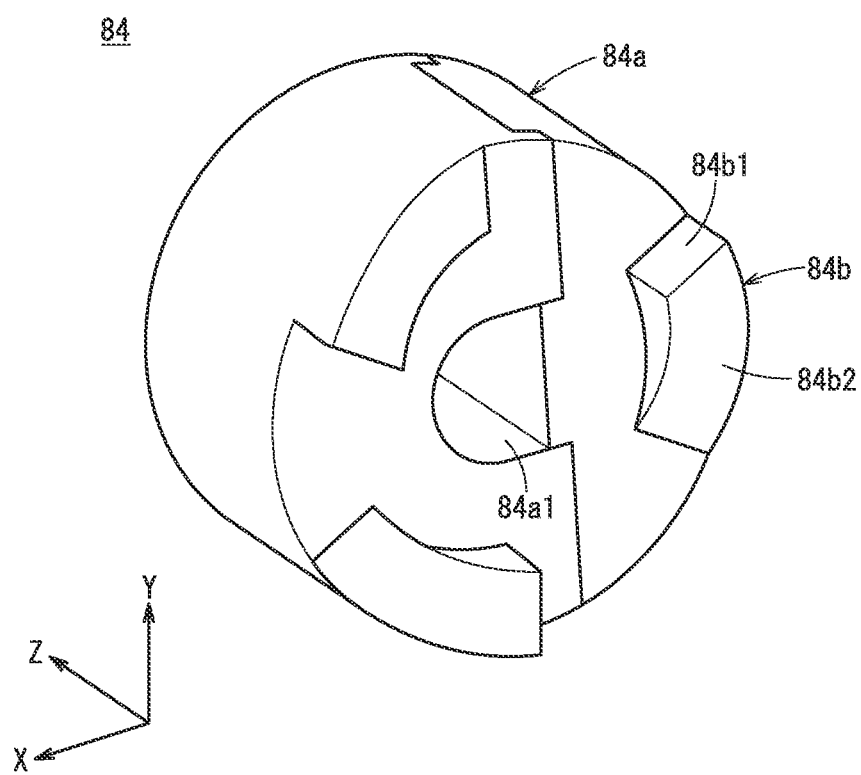
FIG. 26 is a perspective view of the cam.

As shown in FIG. 20, the stopper locking portion 72 includes a cam 84, a latch 86, and a coil spring 88. The cam 84 is provided on the negative Z-axis direction side of the shaft 68, in a manner to be integrally rotatable with the shaft 68. FIG. 25 is a front view of the cam 84. FIG. 26 is a perspective view of the cam 84. The cam 84 includes a body portion 84a and claws 84b, which protrude from the body portion 84a toward the latch 86 side (negative Z-axis direction side). The body portion 84a is a cylindrical member, and a through-hole 84a1 is formed through the center thereof. The shaft 68 passes through the through hole 84a1. As shown in FIG. 25, three claws 84b are provided in the circumferential direction at intervals of 120°. Each claw 84b has a contact surface 84b1 and an inclined surface 84b2. The contact surface 84b1 is a surface parallel to the axial direction of the cam 84 (Z-axis direction). The inclined surface 84b2 is a surface connecting the body portion 84a and the negative Z-axis direction side end portion of the contact surface 84b1, and is inclined relative to the surface of the body portion 84a on the negative Z-axis direction side. Each claw 84b is formed across a range of approximately 75° in the circumferential direction.

Figure 27:
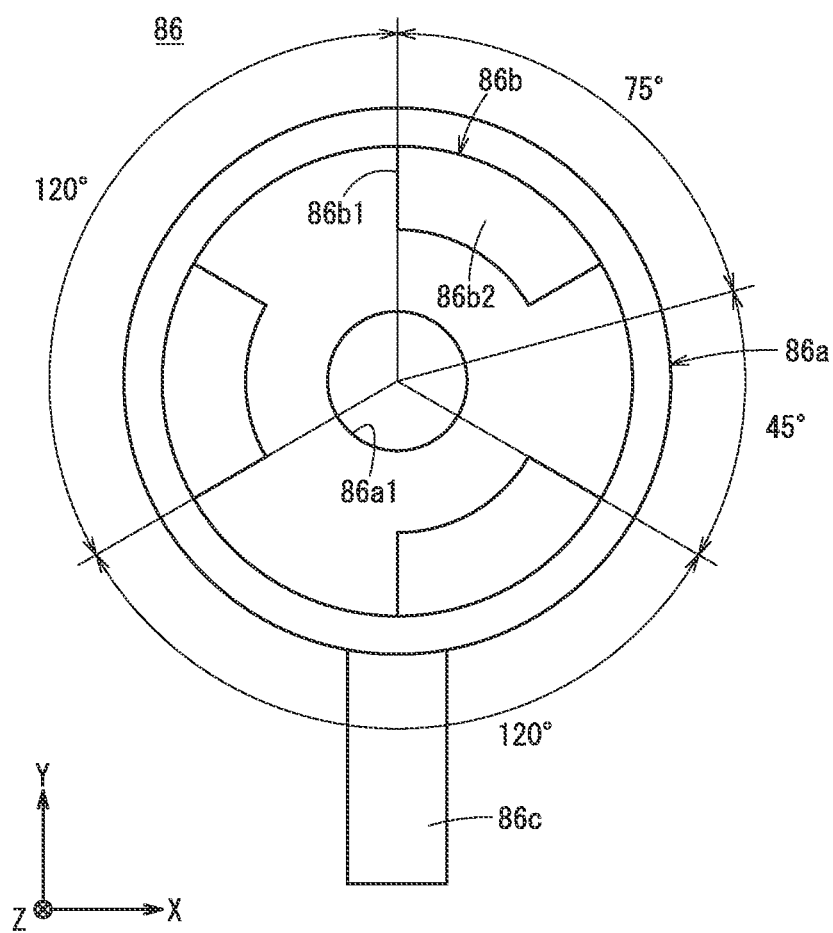
FIG. 27 is a front view of a latch.
Figure 28:
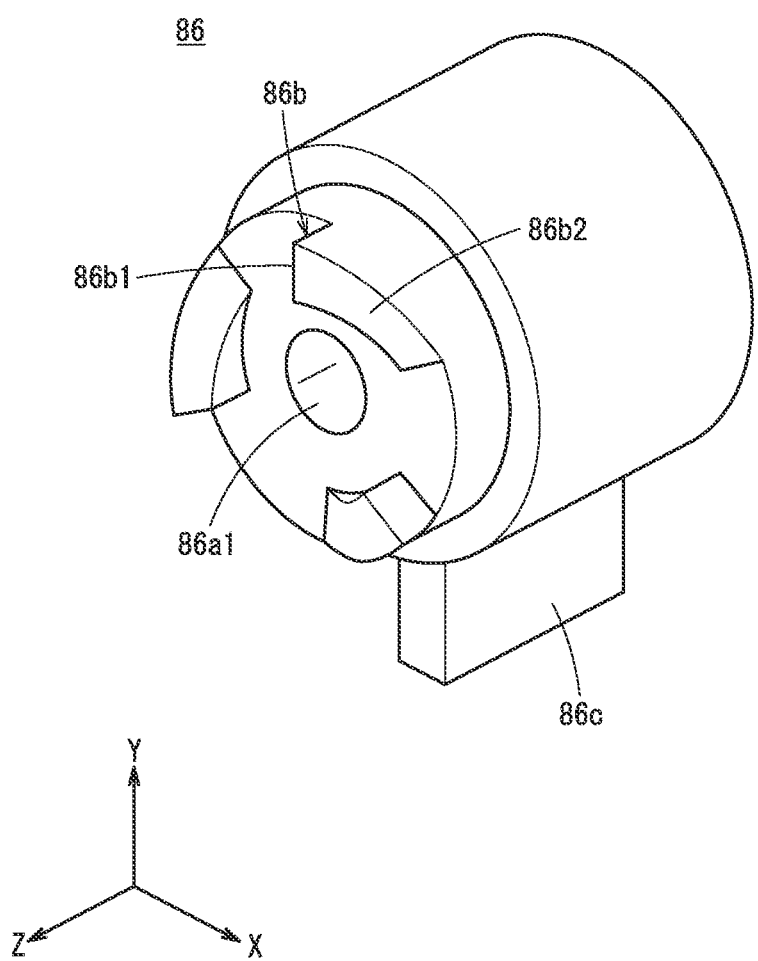
FIG. 28 is a perspective view of the latch.

As shown in FIG. 20, the latch 86 is provided inside a latch holder 90 attached to the main frame 26a so as to be capable of moving in the Z-axis direction but incapable of rotating around the axis of the shaft 68. FIG. 27 is a front view of the latch 86. FIG. 28 is a perspective view of the latch 86. The latch 86 includes a body portion 86a, claws 86b that protrude from the body portion 86a toward the cam 84 side (positive Z-axis direction side), and a pin 86c that extends from the body portion 86a toward the negative Y-axis direction side. The body portion 86a is a tube-shaped member, and a through-hole 86a1 is formed through the center thereof. The shaft 68 passes through the through-hole 86a1. As shown in FIG. 27, three claws 86b are provided in the circumferential direction at intervals of 120°. Each claw 86b has a contact surface 86b1 and an inclined surface 86b2. The contact surface 86b1 is a surface parallel to the axial direction of the latch 86 (Z-axis direction). The inclined surface 86b2 is a surface connecting the body portion 86a and the positive Z-axis direction side end portion of the contact surface 86b1, and is inclined relative to the surface of the body portion 86a on the negative Z-axis direction side. Each claw 86b is formed across a range of approximately 75° in the circumferential direction.

The shaft 68 passes through the through-hole 86a1 of the latch 86, and is rotatably supported by the latch holder 90. The latch 86 is supported by the latch holder 90 in a manner to be capable of moving in the axial direction of the shaft 68 (Z-axis direction) but incapable of being displaced in a rotation direction about the axis of the shaft 68. The latch 86 is biased toward the cam 84 side by the coil spring 88 provided inside the latch holder 90.

When the latch 86 is positioned on the cam 84 side, if the cam 84 attempts to rotate counter-clockwise along with the shaft 68 as seen from the negative Z-axis direction side, the contact surface 84b1 of the claw 84b of the cam 84 contacts the contact surface 86b1 of the claw 86b of the latch 86. Due to this, the latch 86 restricts the rotation of the shaft 68 via the cam 84.

On the other hand, even when the latch 86 is positioned on the cam 84 side, if the cam 84 rotates clockwise along with the shaft 68 as seen from the negative Z-axis direction side, the inclined surface 84b2 of the claw 84b of the cam 84 presses the inclined surface 86b2 of the claw 86b of the latch 86 toward the negative Z-axis direction side, and therefore the shaft 68 can rotate.

When the latch 86 is positioned away from the cam 84, whether the cam 84 rotates clockwise or counter-clockwise along with the shaft 68 as seen from the negative Z-axis direction side, the claw 86b of the latch 86 does not contact the claw 84b of the cam 84, and therefore the shaft 68 can rotate.

Figure 29:
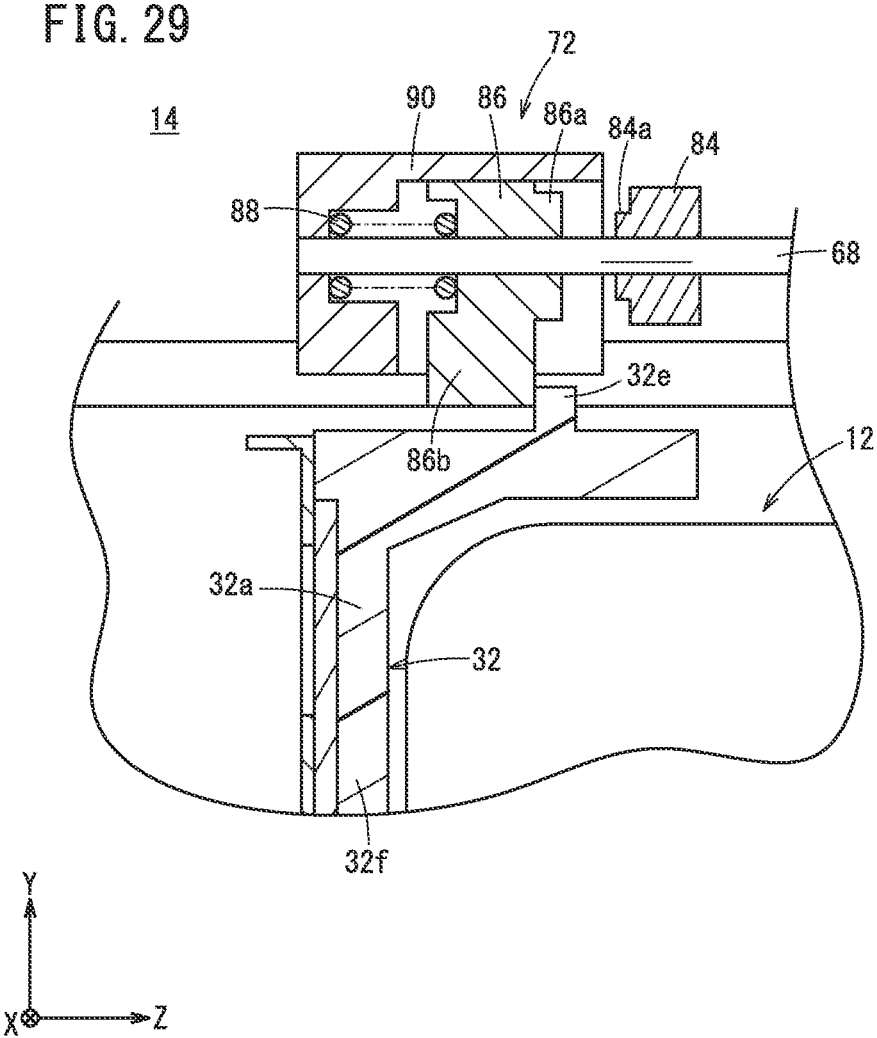
FIG. 29 is an enlarged cross-sectional view of the region near a stopper locking portion of the slot.
Figure 30:
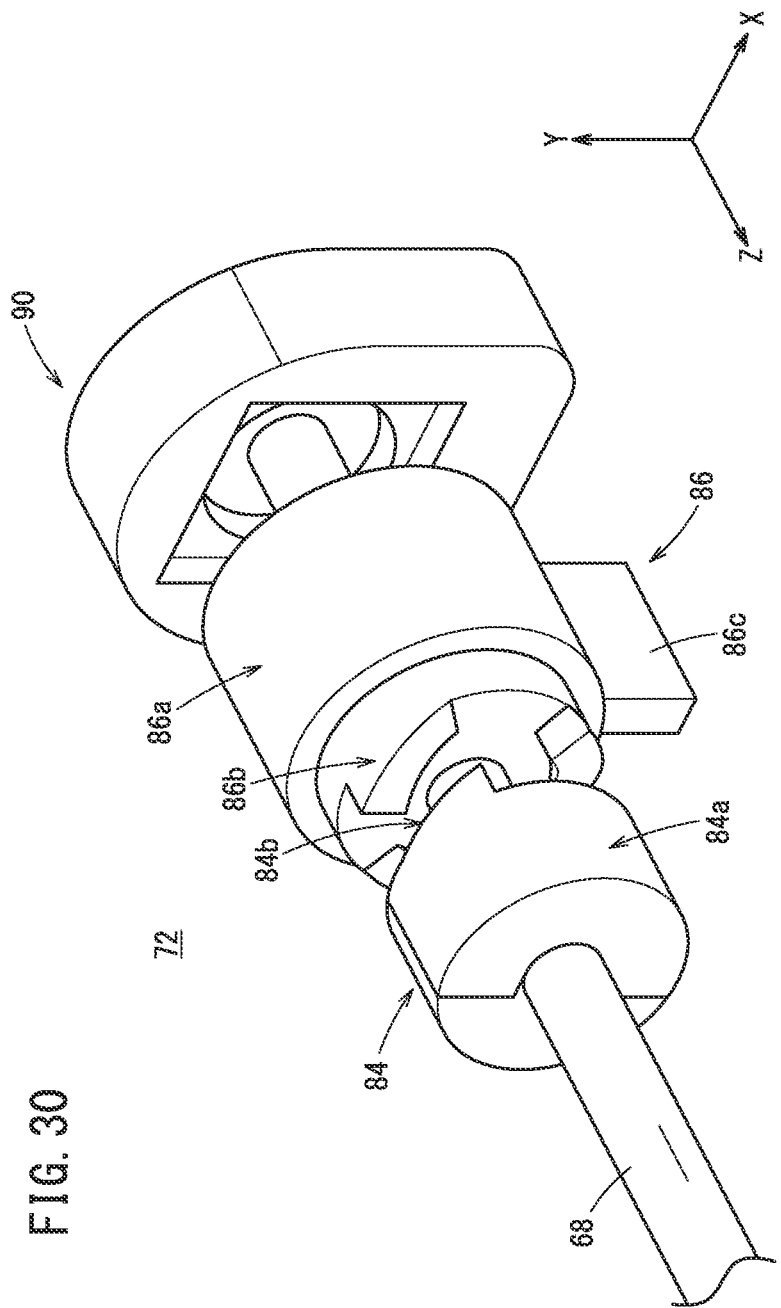
FIG. 30 is an enlarged cross-sectional view of the stopper locking portion of the slot.

FIG. 29 is an enlarged cross-sectional view of the region near the stopper locking portion 72 of the slot 14. The slot 14 shown in FIG. 29 is cut along a plane parallel to the YZ-plane. FIG. 30 is an enlarged perspective view of the stopper locking portion 72 of the slot 14. In FIG. 30, the coil spring 88 and a portion of the latch holder 90 are omitted. FIGS. 29 and 30 show a state in which the mobile battery 12 has been pressed into the slot 14.

A pin 32e that extends toward the positive Y-axis direction side is formed on the surface of the tray body 32f of the battery tray 32 on the positive Y-axis direction side. When the mobile battery 12 is pressed into the slot 14 and the battery tray 32 moves toward the negative Z-axis direction side, the pin 32e of the tray body 32f presses on the pin 86c of the latch 86, causing the latch 86 to move toward the negative Z-axis direction side. Due to this, the claw 86b of the latch 86 and the claw 84b of the cam 84 are disengaged.

As shown in FIG. 21, the stopper lock releasing portion 74 includes a motor 92. The motor 92 is installed on the side surface of the battery holder 30 on the positive Y-axis direction side. A pinion 92a is attached to the drive shaft of the motor 92. The pinion 92a of the motor 92 is attached to the shaft 68, and engages with a gear 94 that rotates integrally with the shaft 68. By the rotational driving of the motor 92, the shaft 68 can be rotated.

Figure 32:
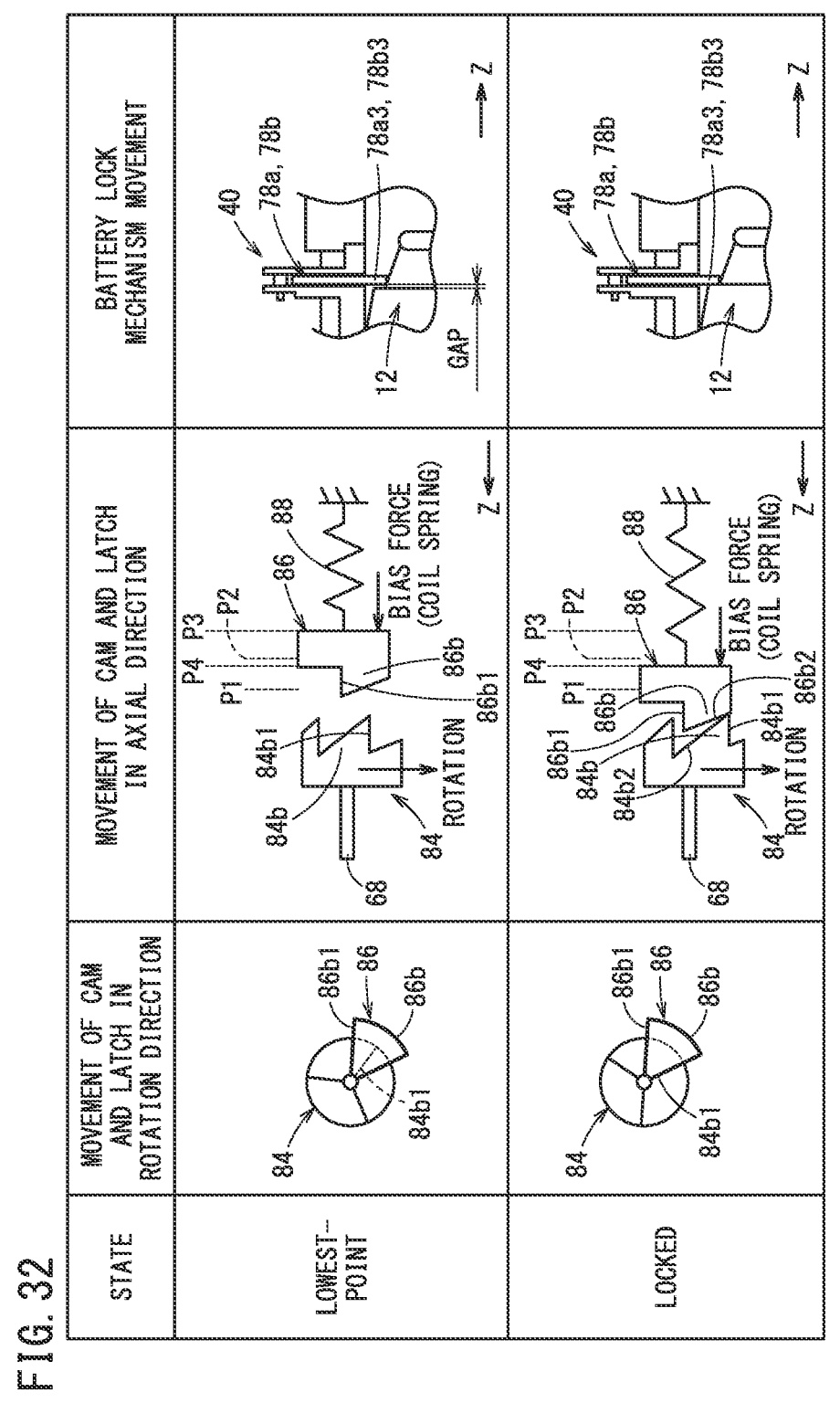

FIGS. 31 and 32 are charts showing the movement of the cam 84 and the latch 86 in the rotation direction, the movement of the cam 84 and the latch 86 in the axial direction, and movement of the battery lock mechanism 40, when the battery lock mechanism 40 transitions from a lock-released state to the locked state. Each drawing shown in FIGS. 31 and 32 is a schematic diagram. FIGS. 31 and 32 show four states, which are a lock-released state, a pre-locking state, a lowest-point state, and a locked state. The lock-released state indicates a state in which the locking of the mobile battery 12 by the battery lock mechanism 40 has been released. The pre-locking state indicates a state immediately before the mobile battery 12 is to be locked by the battery lock mechanism 40. The lowest-point state indicates a state in which the mobile battery 12 has been pressed as far as possible into the slot 14. The locked state indicates a state in which the mobile battery 12 has been locked by the battery lock mechanism 40.

The position of the latch 86 in the Z-axis direction in the lock-released state is defined as P1 (FIG. 31). A bias force toward the positive Z-axis direction side acts on the latch 86 from the coil spring 88, and the latch 86 is pressed against the cam 84. The claw 84b of the cam 84 and the claw 86b of the latch 86 engage with each other. Therefore, although a bias force in the rotation direction acts on the cam 84 from the torsion spring 82 via the shaft 68, the cam 84 does not rotate.

When the mobile battery 12 starts to be pressed into the slot 14 by the user, the pin 32e of the tray body 32f presses on the pin 86c of the latch 86, and the latch 86 moves toward the negative Z-axis direction side. The position of the latch 86 in the Z-axis direction in the pre-locking state is defined as P2 (FIG. 31). In the pre-locking state, the claw 84b of the cam 84 and the claw 86b of the latch 86 still engage with each other. Therefore, although a bias force in the rotation direction acts on the cam 84 from the torsion spring 82 via the shaft 68, the cam 84 does not rotate.

The position of the latch 86 in the Z-axis direction in the lowest-point state is defined as P3 (FIG. 32). At this time, the latch 86 and the cam 84 are separated from each other, and since the claw 84b of the cam 84 and the claw 86b of the latch 86 are disengaged, the cam 84 rotates due to the bias force acting in the rotation direction from the torsion spring 82 via the shaft 68. Due to this, the shaft 68 rotates along with the cam 84, and further, the lever 79 rotates along with the shaft 68, causing the flaps 78a and 78b to lower. In the lowest-point state, a gap is formed between the mobile battery 12 and the stoppers 78a3 and 78b3.

From the lowest-point state, when the force of the user pressing on the mobile battery 12 is removed, the mobile battery 12 moves toward the positive Z-axis direction side due to the force of the gas spring 50 pressing the battery tray 32 toward the positive Z-axis direction side. The mobile battery 12 contacts the stoppers 78a3 and 78b3, and enters the locked state. The position of the latch 86 in the axial direction in the locked state is defined as P4 (FIG. 32). At this time, the latch 86 is pressed toward the cam 84 side by the bias force of the coil spring 88. Since the inclined surface 86b2 of the claw 86b of the latch 86 presses against the inclined surface 84b2 of the claw 84b of the cam 84, the cam 84 rotates further from the position occupied at the time of the lowest-point state.

FIG. 33 is a chart showing the movement of the cam 84 and the latch 86 in the rotation direction and the movement of the cam 84 and the latch 86 in the axial direction, when the battery lock mechanism 40 transitions from the locked state to the lock-released state. Each drawing in FIG. 33 is a schematic diagram. FIG. 33 shows three states, which are the locked state, a mid-lock-release state, and the lock-released state. The locked state indicates a state in which the mobile battery 12 is locked by the battery lock mechanism 40. The mid-lock-release state indicates a state in the midst of the locking of the mobile battery 12 by the battery lock mechanism 40 being released. The lock-released state indicates a state in which the locking of the mobile battery 12 by the battery lock mechanism 40 has been released.

From the locked state, the shaft 68 rotates due to the rotational force of the motor 92, and the cam 84 rotates integrally with the shaft. In the mid-lock-release state, the inclined surface 84b2 of the claw 84b of the cam 84 presses against the inclined surface 86b2 of the claw 86b of the latch 86, and the latch 86 moves toward the positive Z-axis direction side from the position P4, which is the position of the latch 86 in the axial direction in the locked state.

The lever 79 rotates along with the rotation of the shaft 68, the flaps 78a and 78b are raised, and the locking of the mobile battery 12 is released. In the lock-released state, the battery tray 32 moves toward the positive Z-axis direction side due to the bias force of the gas spring 50. In accordance with the pin 32e of the battery tray 32 moving toward the positive Z-axis direction side, the latch 86 moves toward the positive Z-axis direction side due to the bias force of the coil spring 88 and becomes positioned at P1, which is the position of the latch 86 in the axial direction in the lock-released state. Then, the claw 84b of the cam 84 and the claw 86b of the latch 86 engage with each other.

The battery lock mechanism 40 is arranged on the positive Y-axis direction side of the slot 14, together with the tray lock mechanism 38. Therefore, the structures protruding outside of the frame 26 can be concentrated on the positive Y-axis direction side of the slot 14.

Connector Unit

Figure 34:
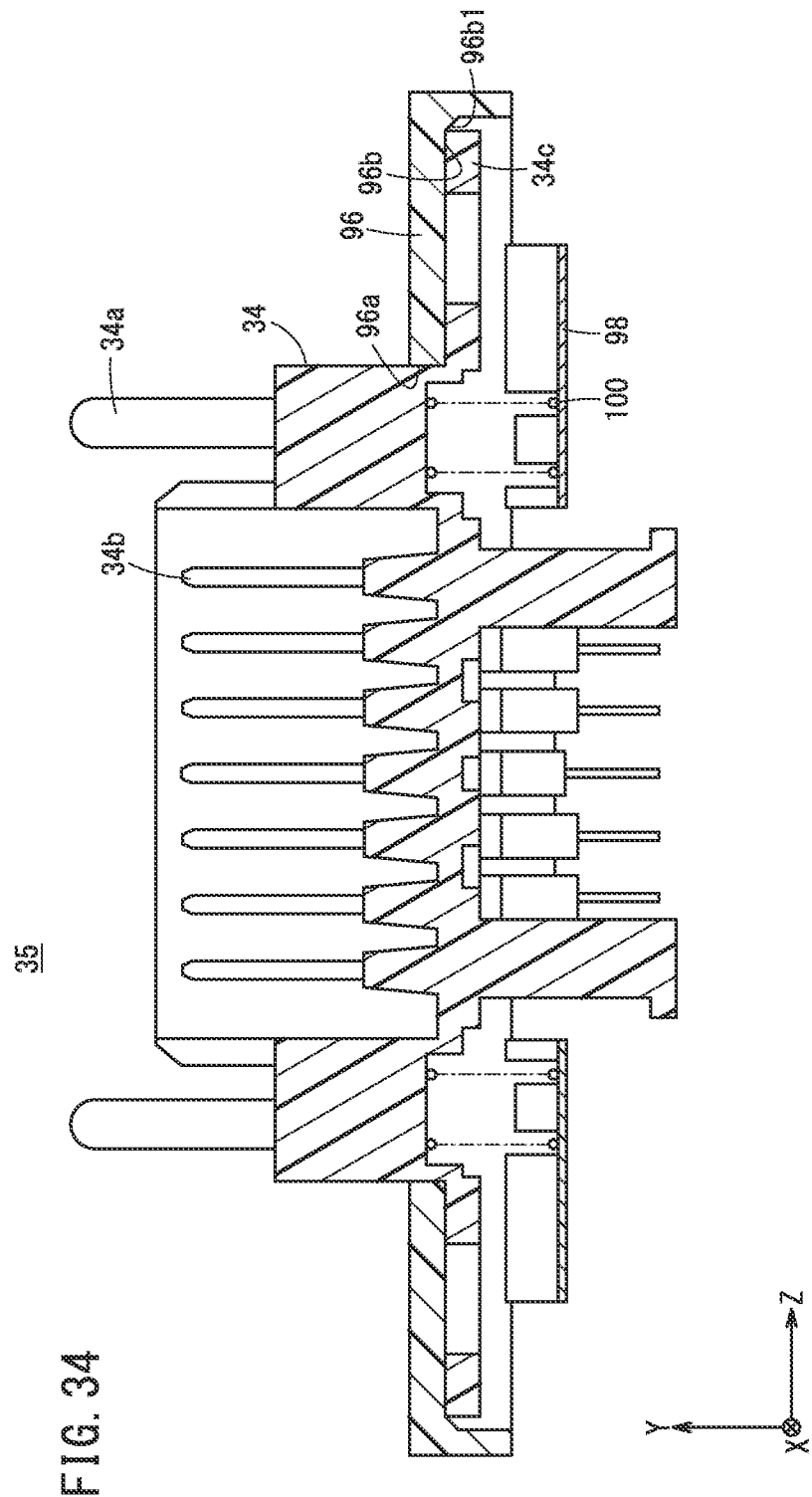
FIG. 34 is a cross-sectional view of a connector unit.
Figure 35:
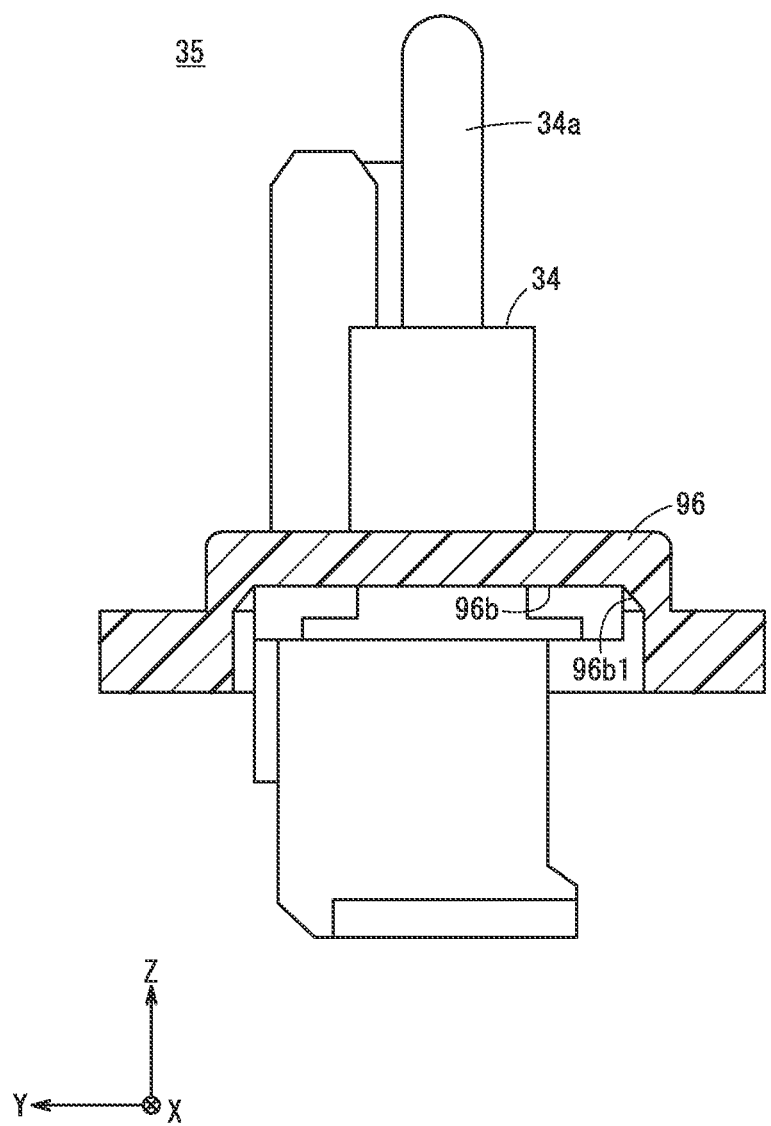
FIG. 35 is a cross-sectional view of the connector unit.

FIGS. 34 and 35 are cross-sectional views of the connector unit 35. The connector unit 35 includes the connector 34, a connector holder 96, a plate 98, and a coil spring 100.

The connector 34 includes a guide protruding portion 34a, terminals 34b, and a flange portion 34c. The guide protruding portion 34a engages with a guide hole 12b1 (FIG. 37) formed in the bottom surface 12a of the mobile battery 12. A pair of the guide protruding portions 34a are provided on outer sides of the terminals 34b in the X-axis direction. The terminals 34b engage with terminal holes (not shown in the drawings) formed in the connector 12b of the mobile battery 12. Power for charging the mobile battery 12 is supplied from the terminals 34b, and a control signal for controlling the charging of the mobile battery 12 is also sent from the terminals 34b. The flange portion 34c is housed in a recessed portion 96b of the connector holder 96, described further below.

Figure 36:
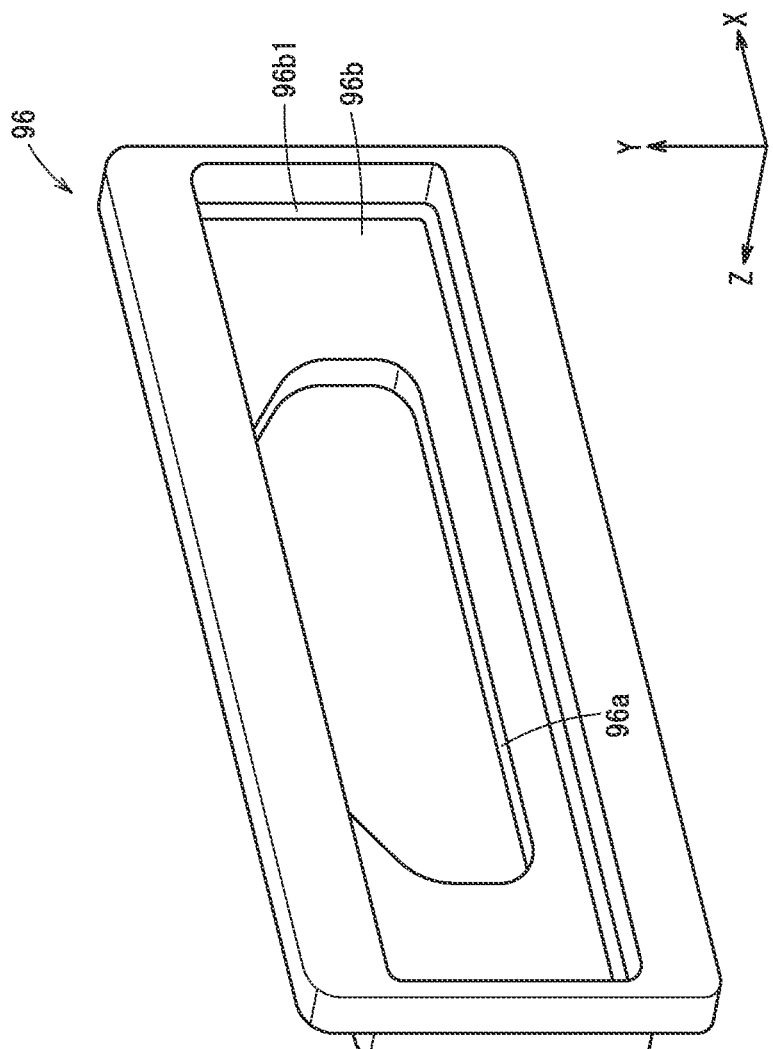
FIG. 36 is a perspective view of the connector unit.

FIG. 36 is a perspective view of the connector holder 96. The connector holder 96 includes a through-hole 96a that passes therethrough in the Z-axis direction, and the guide protruding portions 34a and terminals 34b of the connector 34 are inserted into this through-hole 96a, as shown in FIG. 34. The connector holder 96 includes the recessed portion 96b in the surface thereof on the negative Z-axis direction side. The flange portion 34c of the connector 34 is housed in the recessed portion 96b. A tapered portion 96b1 is formed along the edge of the recessed portion 96b.

As shown in FIG. 34, the plate 98 is fixed to the connector holder 96 on the negative Z-axis direction side. The coil spring 100 is provided between the plate 98 and the connector 34, and the connector 34 is biased toward the positive Y-axis direction side by the coil spring 100.

Figure 37:
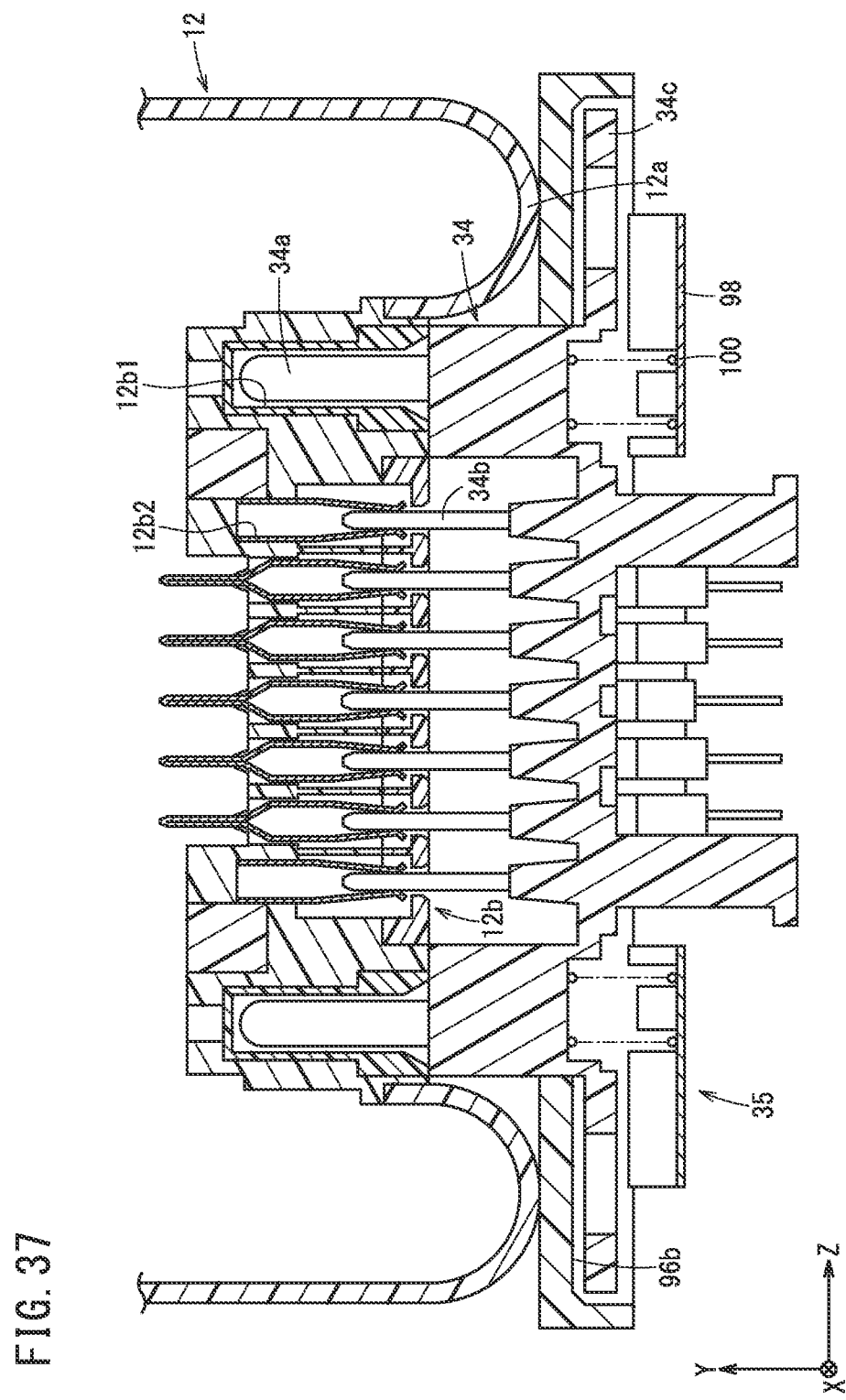
FIG. 37 is a partial cross-sectional view of a state in which a connector of the connector unit has been connected to a connector of the mobile battery.

FIG. 37 is a partial cross-sectional view of a state in which the connector 34 of the connector unit 35 has been connected to the connector 12b of the mobile battery 12. The connector 12b of the mobile battery 12 includes the guide holes 12b1 that engage with the guide protruding portions 34a of the connector 34, and terminal holes 12b2 that engage with the terminals 34b of the connector 34.

Until the terminal 34b of the connector 34 and a terminal hole 12b2 of the mobile battery 12 start to engage, the flange portion 34c of the connector 34 contacts the bottom surface of the recessed portion 96b of the connector holder 96 due to the bias force of the coil spring 100, as shown in FIG. 34.

When the terminal 34b of the connector 34 and the terminal hole 12b2 of the mobile battery 12 start to engage, the connector 34 moves toward the negative Y-axis direction side relative to the connector holder 96, in response to the force toward the negative Y-axis direction side acting on the connector 34 from the mobile battery 12. Due to this, while the terminal 34b of the connector 34 and the terminal hole 12b2 of the mobile battery 12 are engaging with each other, it is possible to ensure the force pressing the connector 34 to the mobile battery 12 side.

After the engagement between the terminal 34b of the connector 34 and the terminal hole 12b2 of the mobile battery 12 has been completed, the flange portion 34c of the connector 34 is separated from the bottom surface of the recessed portion 96b of the connector holder 96, as shown in FIG. 37. Due to this, even if the mobile battery 12 moves some amount inside the slot 14, the terminal 34b of the connector 34 is not disengaged from the terminal hole 12b2 of the mobile battery 12.

When the terminal 34b of the connector 34 is disengaged from the terminal hole 12b2 of the mobile battery 12, the flange portion 34c of the connector 34, which has been separated from the bottom surface of the recessed portion 96b of the connector holder 96, moves toward the bottom surface of the recessed portion 96b due to the bias force of the coil spring 100. At this time, the flange portion 34c of the connector 34 is guided by the tapered portion 96b1 of the recessed portion 96b of the connector holder 96, so that the connector 34 can be centered relative to the connector holder 96.

As shown in FIG. 9, the connector unit 35 is arranged on the positive side of the central portion of the slot 14 in the Y-axis direction. In a state where the slot 14 is installed inside the battery exchanger 10, the connector unit 35 can be arranged on the side far from the ground. Therefore, it is possible to prevent water or the like from contacting the connector unit 35.

Positional Relationship Between Slot and Mobile Battery

Figure 38:
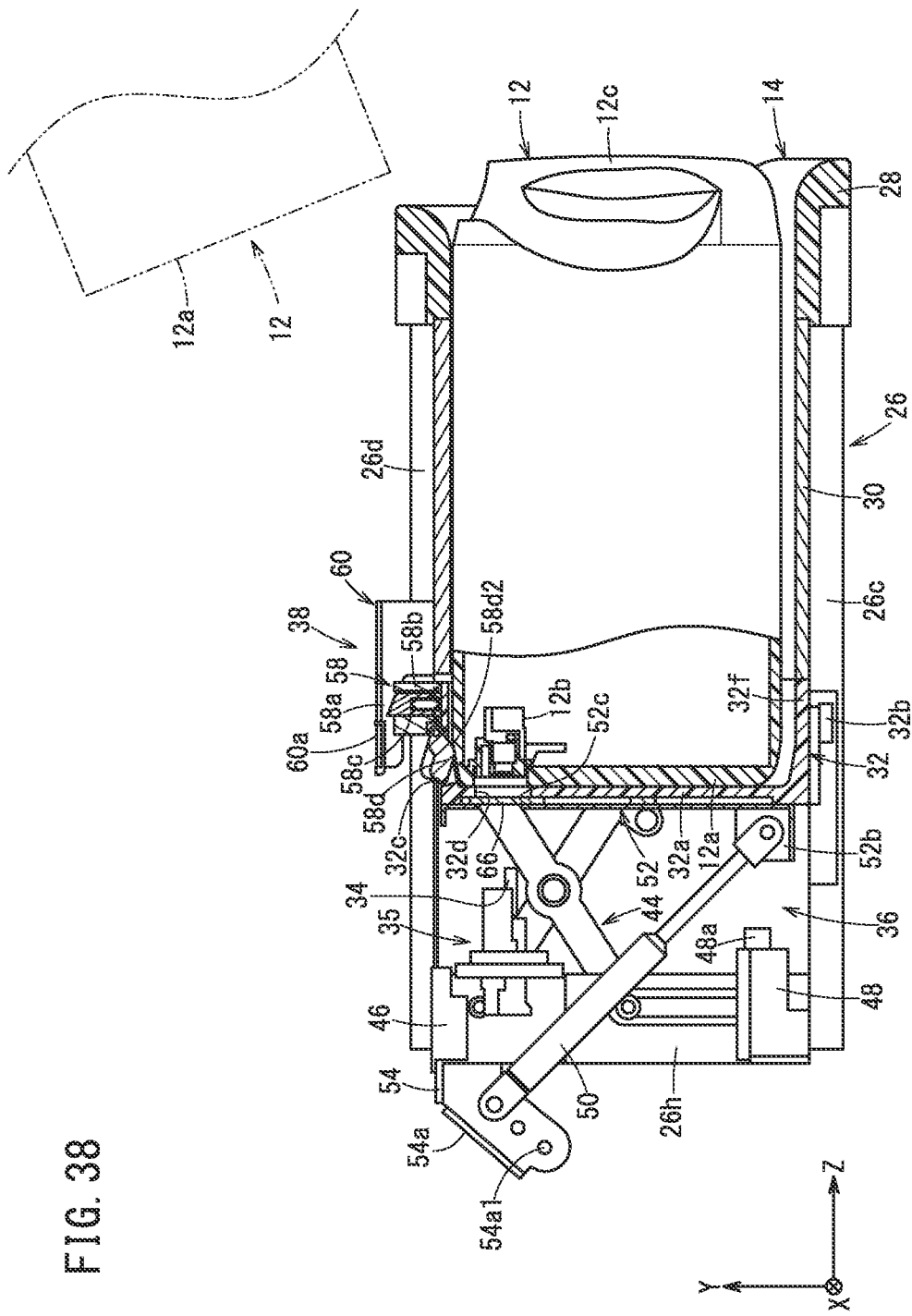
FIG. 38 is a cross-sectional view of the slot.

FIG. 38 is a cross-sectional view of the slot 14. The slot 14 shown in FIG. 38 is cut along a plane parallel to the YZ-plane.

In a state where the mobile battery 12 is inserted into the slot 14, the handle 12c of the mobile battery 12 is positioned farther on the positive Z-axis direction side than the positive Y-axis direction side edge of the insertion port 28, and positioned farther on the negative Z-axis direction side than the negative Y-axis direction side edge of the insertion port 28. Due to this, part of the handle 12c of the mobile battery 12 is exposed outside the slot 14, and therefore the user can easily grasp the handle 12c when taking out the mobile battery 12 from the battery exchanger 10. Furthermore, since the mobile battery 12 does not protrude from the slot 14 toward the positive Z-axis direction side, it is possible to prevent the bottom surface 12a of the mobile battery 12 from colliding with the mobile battery 12 inserted in the slot 14 therebelow when the user takes out the mobile battery 12 from the battery exchanger 10.

A preferred embodiment of the present invention is described above, but the present invention is not limited to the above-described embodiment, and various modifications could be adopted therein without departing from the essence and gist of the present invention.

The insertion port 28 may be attached in a manner to be replaceable singly. The insertion port 28 may have different shapes according to the inclination of the slot 14 installed inside the battery exchanger 10. Furthermore, the insertion port 28 may be made of different materials according to the geographical region where the battery exchanger 10 is installed.

The door 18 of the battery exchanger 10 may be attached as an option. In the first embodiment described above, when the user houses the mobile battery 12 in the slot 14 and closes the door 18, the battery exchanger 10 starts charging the mobile battery 12. Instead, the battery exchanger 10 may start charging the mobile battery 12 when the mobile battery 12 has been pressed into the slot 14.

The battery exchanger 10 corresponds to a holding device of the present invention, the mobile battery 12 corresponds to an electrical device of the present invention, the connector 12b corresponds to a first terminal of the present invention, the slot 14 corresponds to a holding portion of the present invention, the frame 26 corresponds to a casing or a frame portion of the present invention, the battery tray 32 corresponds to the holding portion of the present invention, the through-hole 32c corresponds to another insertion portion of the present invention, the through-hole 32d corresponds to an insertion portion of the present invention, the pin 32e corresponds to an operation element of the present invention, the connector 34 corresponds to a second terminal of the present invention, the tray lock mechanism 38 corresponds to a movement restriction portion of the present invention, the battery lock mechanism 40 corresponds to a withdrawal restriction portion of the present invention, the X-link 44 corresponds to a driving portion of the present invention, the gas spring 50 corresponds to another driving portion or an energy accumulation portion of the present invention, the latch 58 corresponds to a second engaging element of the present invention, the lever 58d corresponds to a protruding portion of the present invention, the strike 60 corresponds to a first engaging element of the present invention, the link 62a corresponds to a connecting portion of the present invention, the link 62b corresponds to another connecting portion of the present invention, the rod 64a corresponds to a coupling portion of the present invention, the shutter 66 corresponds to a cover portion of the present invention, the shaft 68 corresponds to an activation connecting portion of the present invention, the flaps 78a and 78b each correspond to an advancing/retreating portion of the present invention, the torsion spring 82 corresponds to a biasing portion of the present invention, the cam 84 and the latch 86 each correspond to an activating element of the present invention, and the motor 92 corresponds to a rotational portion of the present invention.

Second Embodiment

Figure 39:
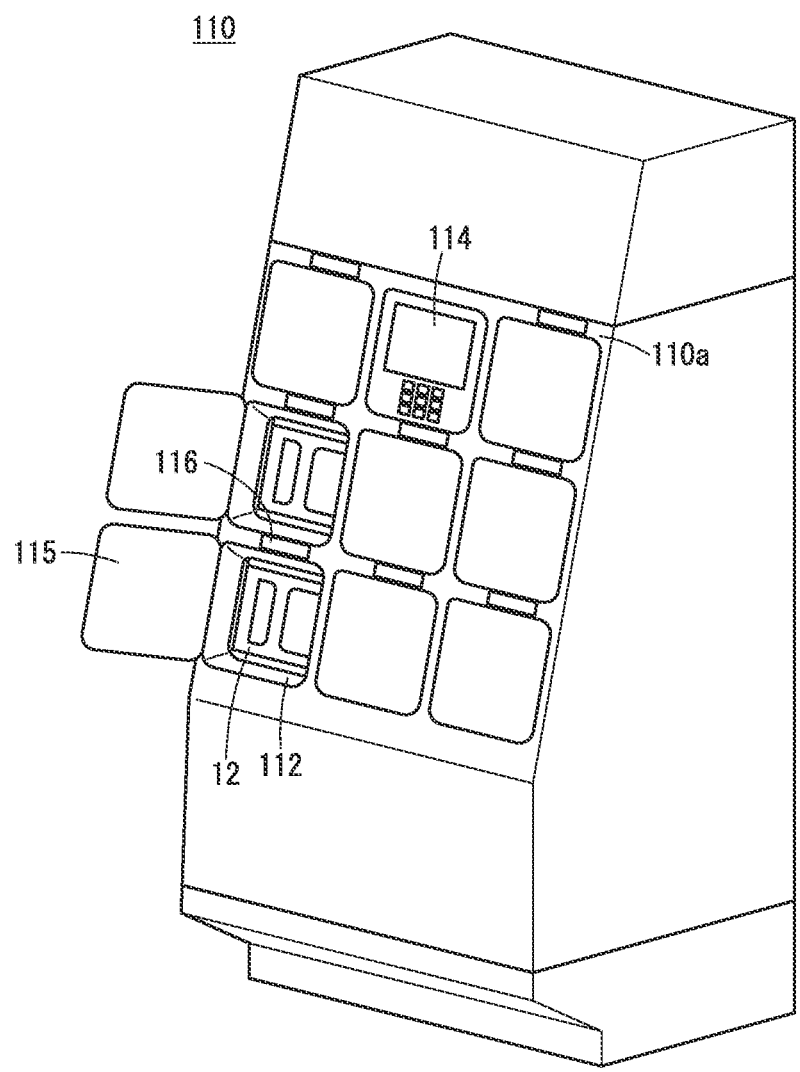
FIG. 39 is a schematic exterior view of a battery energy storage.

FIG. 39 is a schematic exterior view of a battery energy storage 110. The battery energy storage 110 houses a plurality (eight in the present embodiment) of mobile batteries 12 therein. The mobile batteries 12 inside the battery energy storage 110 are normally fully charged, and the power accumulated in the mobile batteries 12 is discharged during a power outage or the like, for example. The mobile batteries 12 used in the battery energy storage 110 are batteries that have deteriorated due to repeated use in an electric motorcycle, for example, such that the state of health (SOH) thereof is no longer suitable for use in the electric motorcycle or the like. Furthermore, the mobile batteries 12 used in the battery energy storage 110 may be new batteries that have not deteriorated. Yet further, some of the mobile batteries 12 used in the battery energy storage 110 may be deteriorated, and the remaining mobile batteries 12 may be new batteries.

The battery energy storage 110 includes eight slots 112 and one operation panel 114. The mobile batteries 12 are housed in the slots 112. Unlike in the battery exchanger 10 of the first embodiment, the mobile batteries 12 are not taken in and out of the battery energy storage 110 frequently. The mobile batteries 12 housed in the battery energy storage 110 are exchanged when the mobile battery 12 has malfunctioned or when the mobile battery 12 has deteriorated significantly, for example. An indicator 116 is provided above the slot 112. The indicator 116 displays the deterioration states of the mobile batteries 12 housed in the slots 112 by lighting up with a certain color, blinking, or the like. The operation panel 114 is a device that is operated by the user. The user can start supplying power from the battery energy storage 110 to the outside, for example, by operating the operation panel 114. The battery energy storage 110 includes a door 115 that closes the open portion of each slot 112. These doors 115 may be attached as options.

Figure 40:
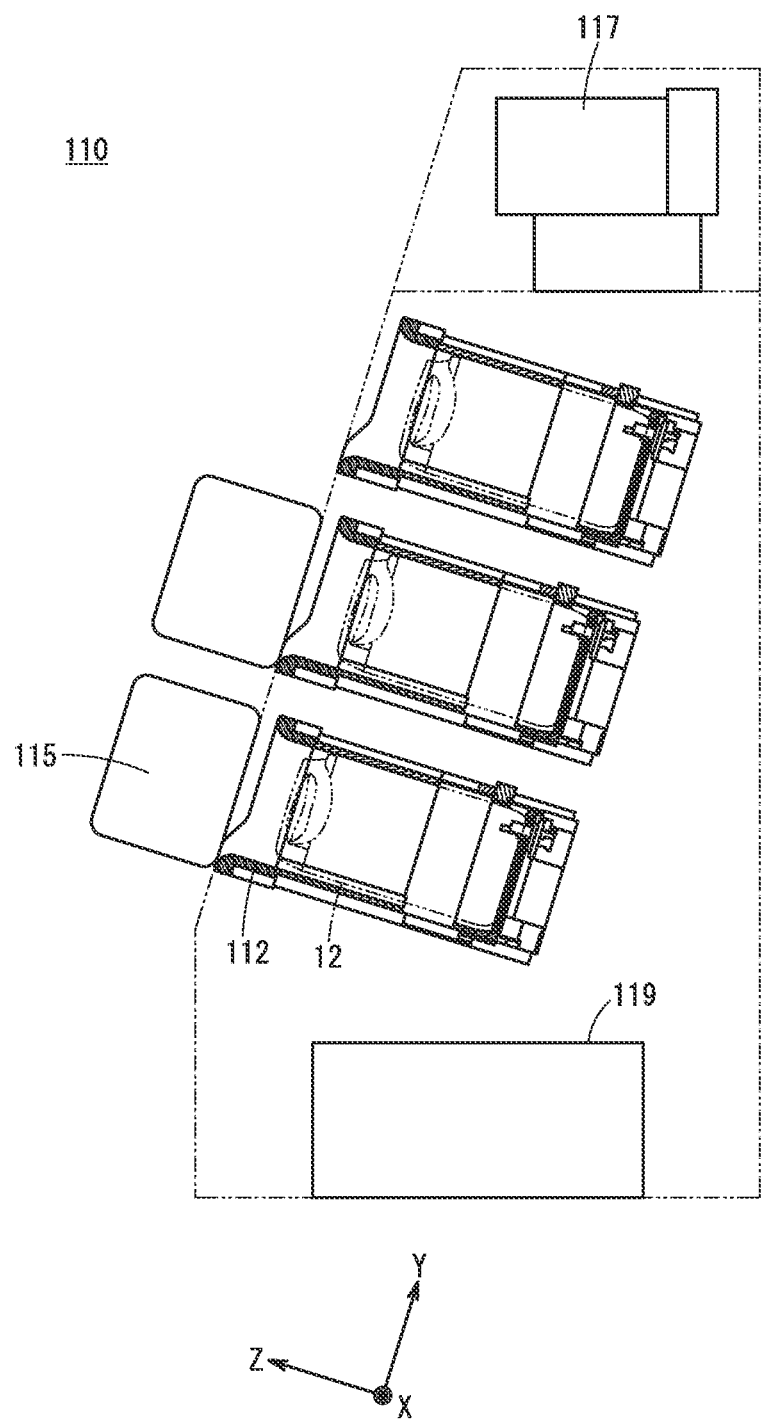
FIG. 40 is a cross-sectional view of the battery energy storage.

FIG. 40 is a cross-sectional view of the battery energy storage 110. The battery energy storage 110 includes a control apparatus 117 above the slots 112. The control apparatus 117 performs charging control, power supply control, and the like for the mobile batteries 12. When the mobile battery 12 is to be charged, the control apparatus 117 controls an AC/DC converter (not shown in the drawings) to convert AC power supplied from a commercial power source into DC power and supply this power to the mobile battery 12. When the mobile battery 12 is to be discharged, the control apparatus 117 controls a DC/AC converter (not shown in the drawings) to convert the DC power output from the mobile battery 12 into a AC power and supply this power to the outside. The battery energy storage 110 includes a utility space 119 below the slots 112. A cooling apparatus for cooling the inside of the battery energy storage 110, for example, is installed in the utility space 119 as optional equipment.

In the present embodiment, the description is provided with the X-axis, the Y-axis, and the Z-axis being defined as follows. The direction in which the mobile battery 12 is inserted into the slot 112 is the Z-axis direction, and the side on which the slot 112 opens on a front surface 110*a* of the battery energy storage 110 is the positive side. The direction parallel to the width direction of the battery energy storage 110 is the X-axis direction, and the right side, when viewed from the side on which the slot 112 opens on the front surface 110*a* of the battery energy storage 110, is the positive side. The direction orthogonal to the Z-axis and the X-axis is the Y-axis direction, with the upper side being the positive side.

Figure 41:
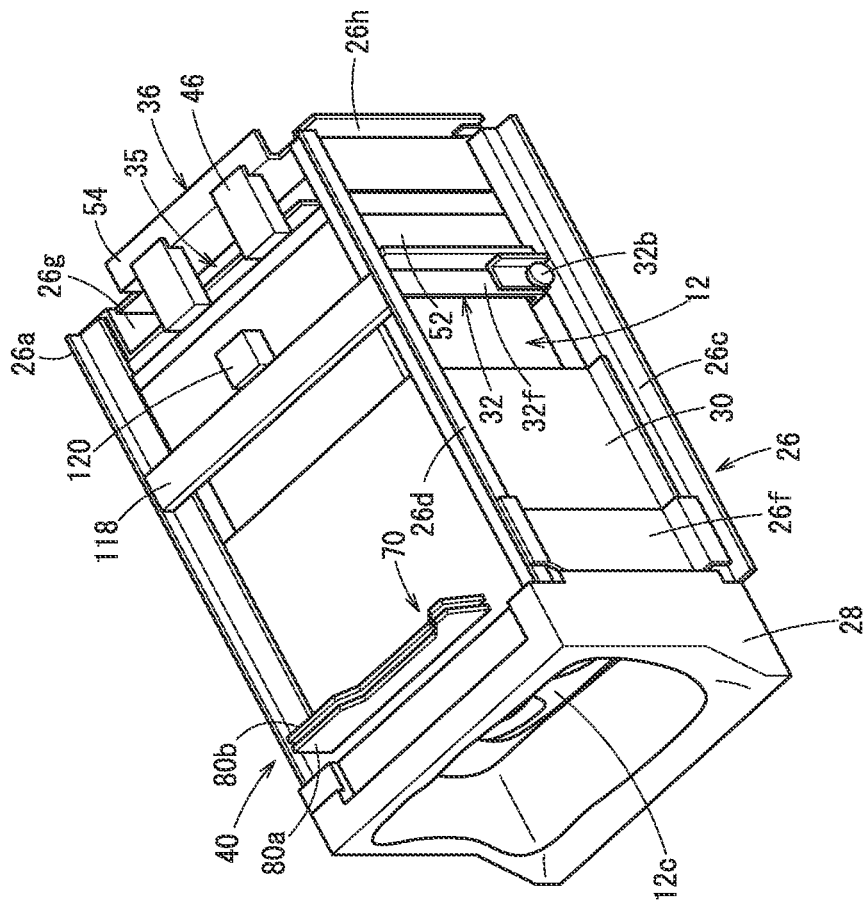
FIG. 41 is a perspective view of the slot with the mobile battery housed therein.
Figure 42:
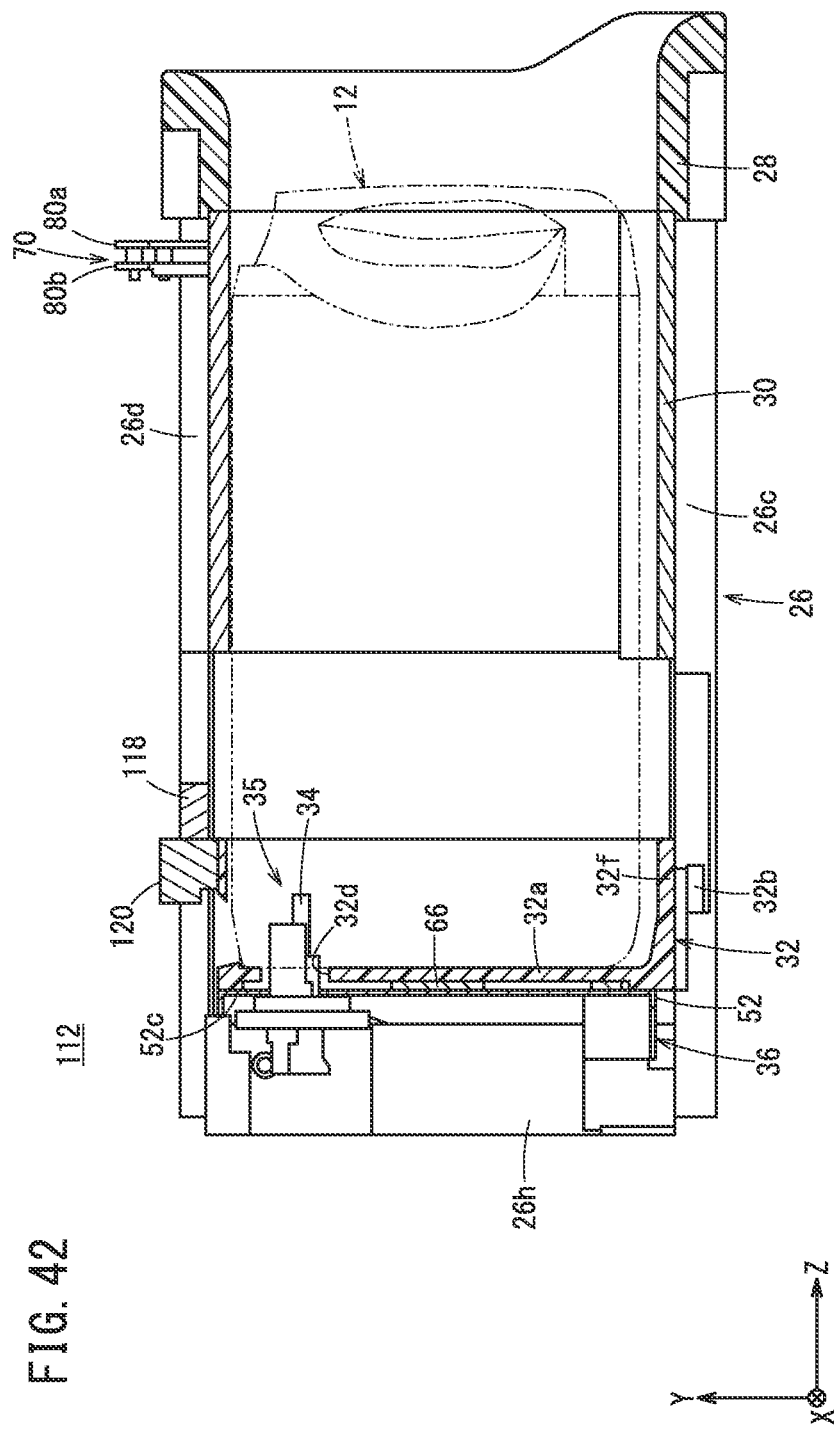
FIG. 42 is a cross-sectional view of the slot with the mobile battery housed therein.
Figure 43:
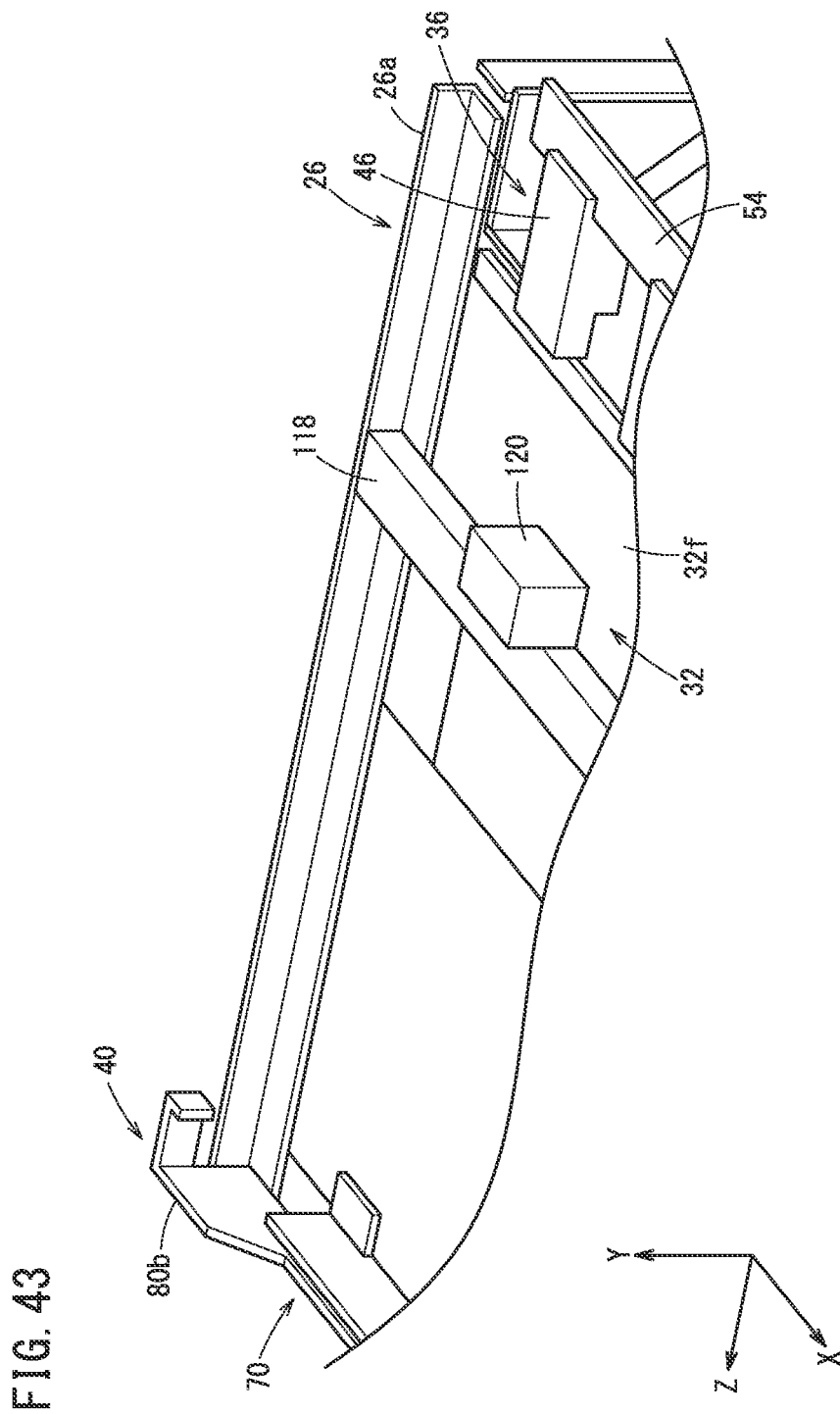
FIG. 43 is a partial perspective view of a side surface of the slot on the positive Y-axis direction side.

FIG. 41 is a perspective view of the slot 112 in a state where the mobile battery 12 is housed therein. FIG. 42 is a cross-sectional view of the slot 112 in a state where the mobile battery 12 is housed therein. The slot 112 shown in FIG. 42 is cut along a plane parallel to the YZ-plane. FIG. 43 is a partial perspective view of the side surface of the slot 112 on the positive Y-axis direction side.

The slot 112 of the battery energy storage 110 has substantially the same configuration as the slot 14 of the battery exchanger 10 in the first embodiment, but does not have part of the configuration of the tray holding mechanism 36, the entire configuration of the tray lock mechanism 38, and part of the configuration of the battery lock mechanism 40 that are included in the slot 14. Specifically, the slot 112 does not include the X-links 44, the air dampers 48, and the gas spring 50 of the tray holding mechanism 36. On the other hand, the slot 112 includes the stoppers 46 of the tray holding mechanism 36. Furthermore, the slot 112 does not include the latch 58 and the strike 60 of the tray lock mechanism 38. Yet further, the slot 112 does not include the shaft 68, the stopper locking portion 72, and the stopper lock releasing portion 74 of the battery lock mechanism 40. Additionally, the slot 112 does not include the lever 79 and the torsion spring 82 of the stopper driving portion 70, but does include the flaps 78*a* and 78*b* of the stopper driving portion 70.

Concerning the configuration of the slot 112 of the battery energy storage 110, elements that have the same configuration as the slot 14 of the battery exchanger 10 are given the same reference numerals as in the first embodiment and descriptions thereof are omitted.

The slot 112 of the battery energy storage 110 includes a tray lock board 118 installed to bridge between the main frame 26*a* and the main frame 26*d*. A protruding portion 120 that protrudes to the positive Y-axis direction side is fixed to the side surface of the tray body 32*f* of the battery tray 32 on the positive Y-axis direction side. At a position where the battery tray 32 has moved to the negative Z-axis direction side, the movement of the battery tray 32 to the positive Z-axis direction side is restricted due to the protruding portion 120 contacting the tray lock board 118 from the negative Z-axis direction side.

Figure 44:
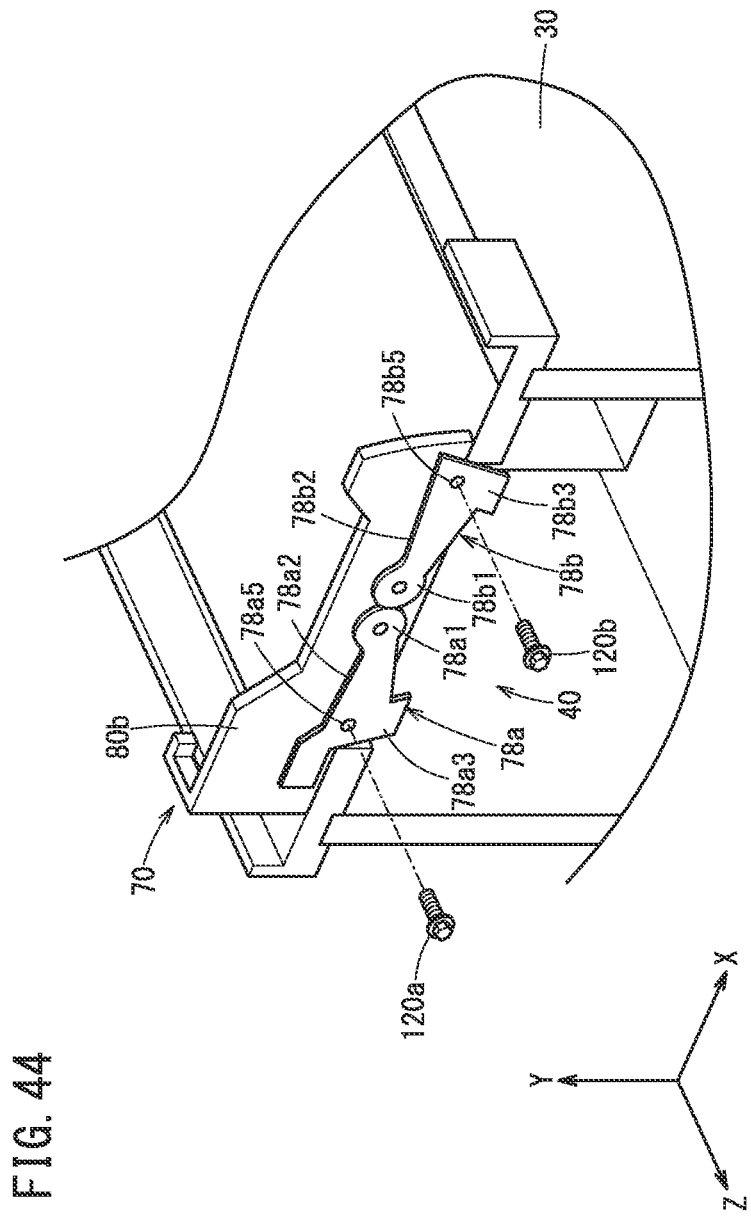
FIG. 44 is an enlarged perspective view of the battery lock mechanism.
Figure 45:
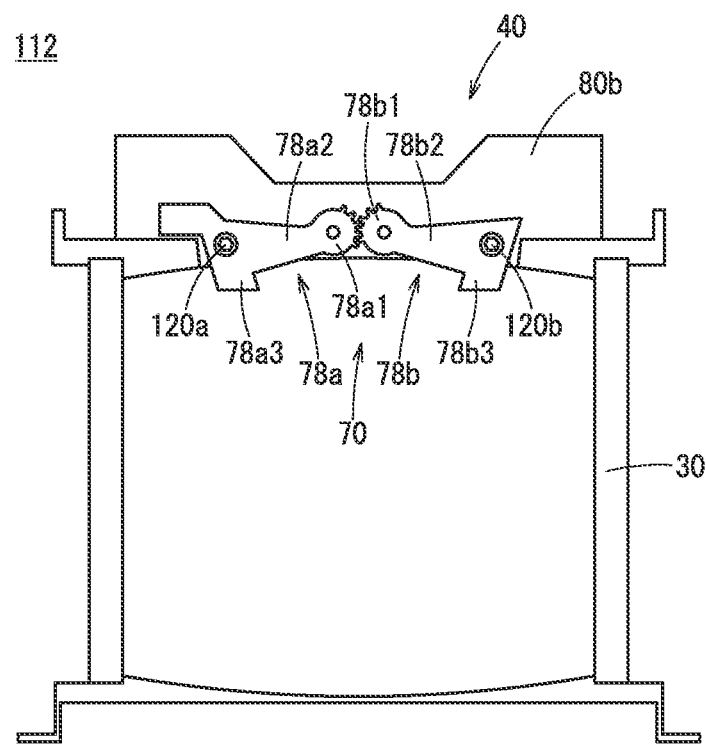
FIG. 45 is a cross-sectional front view of the slot.
Figure 46:
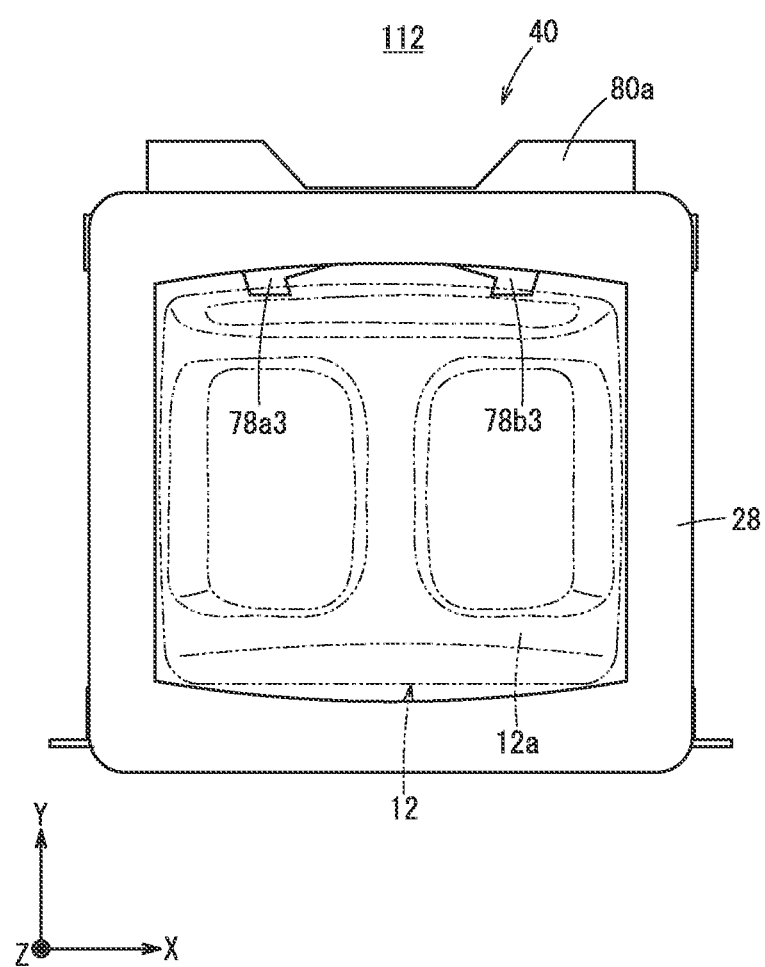
FIG. 46 is a front view of the slot.

FIG. 44 is an enlarged perspective view of the battery lock mechanism 40. FIG. 45 is a cross-sectional front view of the slot 112. The slot 112 shown in FIG. 45 is cut along a plane parallel to the XY-plane. FIG. 46 is a front view of the slot 112.

The flaps 78*a* and 78*b* respectively include bolt holes 78*a*5 and 78*b*5 to which bolts are fixed. The battery lock mechanism 40 is fixed by bolts 120*a* and 120*b* in a state where the flaps 78*a* and 78*b* are lowered. Due to this, when the mobile battery 12 is pulled out from the slot 112, the mobile battery 12 is caught on the stoppers 78*a*3 and 78*b*3, and the movement of the mobile battery 12 toward the positive Z-axis direction side is restricted. Accordingly, theft of the mobile battery 12 can be prevented.

The battery energy storage 110 corresponds to the holding device of the present invention, the bolt holes 78*a*5 and 78*b*5 each correspond to a fixing counterpart portion of the present invention, and the bolts 120a and 120b each correspond to a fixing member of the present invention.

LIST OF REFERENCE NUMERALS

10: battery exchanger (holding device)
12: mobile battery (electrical device)
12b: connector (first terminal)
14: slot (holding portion)
26: frame (casing, frame portion)
32: battery tray (holding portion)
32c: through-hole (other insertion portion)
32d: through-hole (insertion portion)
32e: pin (operation element)
32f: tray body (holding portion body)
34: connector (second terminal)
38: tray lock mechanism (movement restriction portion)
40: battery lock mechanism (withdrawal restriction portion)
44: X-link (driving portion)
50: gas spring (other driving portion, energy accumulating portion)
52: tray bracket (support portion)
58: latch (second engaging element)
58d: lever (protruding portion)
60: strike (first engaging element)
62a: link (connecting portion)
62b: link (other connecting portion)
64a: rod (coupling portion)
66: shutter (cover portion)
68: shaft (activation connecting portion)
78a, 78b: flap (advancing/retreating portion)
78a5, 78b5: bolt hole (fixing counterpart portion)
82: torsion spring (biasing portion)
84: cam (activating element)
86: latch (activating element)
92: motor (rotational portion)
110: battery energy storage (holding device)
120a, 120b: bolt (fixing member)

The invention claimed is:

1. A holding device that holds an electrical device housed or placed therein, the electrical device including a first terminal, the holding device comprising:
a holding portion configured to hold the electrical device;
a second terminal that is provided to be movable relative to the holding portion and connected to the first terminal;
an insertion portion that is provided in the holding portion, the second terminal being inserted into the insertion portion; and
a cover portion that is provided to be movable relative to the holding portion and configured to cover at least part of the insertion portion, wherein:
the holding portion is configured to move to at least a first position and a second position; and
the holding device comprises a driving portion configured to move the cover portion in a manner that a covered amount of the insertion portion differs between when the holding portion is at the first position and when the holding portion is at the second position.

2. The holding device according to claim 1, wherein:
the driving portion includes a connecting portion that is connected to a casing of the holding device or a frame portion of the holding device and to the holding portion; and
the connecting portion is provided so as to be driven in conjunction with movement of the holding portion to the first position and the second position.

3. The holding device according to claim 2, wherein the driving portion further includes another connecting portion that is provided in parallel with the connecting portion and connected to the casing or the frame portion and to the holding portion.

4. The holding device according to claim 3, wherein the driving portion further includes a coupling portion configured to couple the connecting portion and the another connecting portion to each other in a manner that the connecting portion and the another connecting portion are pivotable around a common pivotal axis line.

5. The holding device according to claim 4, wherein the coupling portion is arranged in a manner that a distance between the casing or the frame portion and the coupling portion is substantially equal to a distance between the holding portion and the coupling portion.

6. The holding device according to claim 1, wherein:
the driving portion moves the cover portion to a position where the cover portion is allowed to cover the insertion portion, when the holding portion is at the first position; and
the driving portion moves the cover portion to a position where the second terminal is allowed to be inserted into the insertion portion, when the holding portion is at the second position.

7. The holding device according to claim 1, further comprising another driving portion that is connected to a casing of the holding device or a frame portion of the holding device and to the holding portion, and configured to drive the holding portion.

8. The holding device according to claim 7, wherein the another driving portion includes an energy accumulating portion configured to accumulate energy when the holding portion receives a load of the electrical device and moves from the first position to the second position, and release energy when the holding portion moves from the second position to the first position.

9. The holding device according to claim 1, wherein:
the holding portion includes a holding portion body, and a support portion that is arranged so as to support the holding portion body on a side of the second terminal; and
the cover portion is arranged between the holding portion body and the support portion.

10. The holding device according to claim 9, wherein the cover portion is formed in a flat plate shape.

11. A holding device that holds an electrical device housed or placed therein, the electrical device including a first terminal, the holding device comprising:
a holding portion configured to hold the electrical device;
a second terminal that is provided to be movable relative to the holding portion and connected to the first terminal;
an insertion portion that is provided in the holding portion, the second terminal being inserted into the insertion portion; and
a cover portion that is provided to be movable relative to the holding portion and configured to cover at least part of the insertion portion, wherein:
the holding portion is configured to move to at least a first position and a second position; and the holding device comprises a movement restriction portion configured to restrict movement of the holding portion toward the second position, when the holding portion is at the first position.

12. The holding device according to claim 11, wherein:
the movement restriction portion includes a first engaging element that is arranged on a casing of the holding device or a frame portion of the holding device, and a second engaging element that is configured to engage with and disengage from the first engaging element and arranged on the holding portion; and
the second engaging element is provided to be movable relative to the holding portion so as to:
engage with the first engaging element in a state where the electrical device is not held by the holding portion; and
disengage from the first engaging element in a state where the electrical device is held by the holding portion.

13. The holding device according to claim 12, wherein:
the holding portion includes another insertion portion into which the second engaging element is inserted; and
the second engaging element includes a protruding portion that is configured to advance into and retreat from the holding portion through the another insertion portion.

14. The holding device according to claim 13, wherein the protruding portion is arranged at a position where the protruding portion is allowed to contact the electrical device, in a state where the electrical device is held by the holding portion.

15. The holding device according to claim 14, wherein the protruding portion and at least one of the holding portion or the electrical device are formed or arranged in a manner that, in a state where the electrical device is held with an incorrect posture by the holding portion, the protruding portion does not contact the electrical device.

16. The holding device according to claim 11, wherein: the holding portion is configured to move to at least a first position and a second position; and the holding device comprises a withdrawal restriction portion configured to restrict withdrawal of the electrical device held by the holding portion, when the holding portion is at the second position.

17. The holding device according to claim 16, wherein the withdrawal restriction portion includes:
an advancing/retreating portion that, in a state where the electrical device is held by the holding portion, is arranged on an opposite side of the electrical device to the holding portion and is configured to advance and retreat on a movement trajectory of the electrical device;
an activation element that is arranged on a casing of the holding device or a frame portion of the holding device, and is arranged so as to be allowed to contact an operation element arranged on the holding portion when the holding portion is positioned near the second position; and
an activation connecting portion configured to mechanically connect the advancing/retreating portion and the activation element.

18. The holding device according to claim 17, wherein the activation connecting portion includes:
a biasing portion configured to bias the activation connecting portion to rotate in one direction; and
a rotational portion configured to drive the activation connecting portion to rotate in a reverse direction that is opposite to the one direction.

19. The holding device according to claim 17, wherein the second engaging element and the operation element are arranged on surfaces of the holding portion that face a same direction.

20. The holding device according to claim 16, comprising:
an advancing/retreating portion that, in a state where the electrical device is held by the holding portion, is arranged on an opposite side of the electrical device to the holding portion and is configured to advance and retreat on a movement trajectory of the electrical device, wherein
the withdrawal restriction portion includes a fixing counterpart portion to which a fixing member is fixed, the fixing member fixing the advancing/retreating portion at a retreated position.

21. A holding device that holds an electrical device housed or placed therein, the electrical device including a first terminal,
the holding device comprising:
a holding portion configured to hold the electrical device; and
a second terminal that is provided to be movable relative to the holding portion and connected to the first terminal, wherein:
the holding portion is configured to move to at least a first position and a second position; and
the holding device comprises a movement restriction portion configured to restrict movement of the holding portion toward the second position, when the holding portion is at the first position.

22. A holding device that holds an electrical device housed or placed therein, the electrical device including a first terminal,
the holding device comprising:
a holding portion configured to hold the electrical device; and
a second terminal that is provided to be movable relative to the holding portion and connected to the first terminal, wherein:
the holding portion is configured to move to at least a first position and a second position; and
the holding device comprises a withdrawal restriction portion configured to restrict withdrawal of the electrical device held by the holding portion, when the holding portion is at the second position.

* * * * *